(12) United States Patent
Togashi et al.

(10) Patent No.: US 11,999,818 B2
(45) Date of Patent: Jun. 4, 2024

(54) HIGH MOLECULAR WEIGHT TRIARYLAMINE COMPOUND COMPRISING TERPHENYL STRUCTURE IN MOLECULAR MAIN CHAIN AND ORGANIC ELECTROLUMINESCENT ELEMENT COMPRISING SAID HIGH MOLECULAR WEIGHT COMPOUND

(71) Applicant: HODOGAYA CHEMICAL CO., LTD., Tokyo (JP)

(72) Inventors: Kazunori Togashi, Tokyo (JP); Hideyoshi Kitahara, Tokyo (JP); Junichi Izumida, Tokyo (JP); Hiroki Hirai, Tokyo (JP); Mika Shinoda, Tokyo (JP)

(73) Assignee: HODOGAYA CHEMICAL CO., LTD., Tokyo (JP)

(*) Notice: Subject to any disclaimer, the term of this patent is extended or adjusted under 35 U.S.C. 154(b) by 833 days.

(21) Appl. No.: 16/972,672

(22) PCT Filed: Jul. 1, 2019

(86) PCT No.: PCT/JP2019/026149
§ 371 (c)(1),
(2) Date: Dec. 7, 2020

(87) PCT Pub. No.: WO2020/009069
PCT Pub. Date: Jan. 9, 2020

(65) Prior Publication Data
US 2021/0253785 A1    Aug. 19, 2021

(30) Foreign Application Priority Data
Jul. 3, 2018  (JP) .................. 2018-126980

(51) Int. Cl.
*H01L 51/50* (2006.01)
*C08G 61/12* (2006.01)
(Continued)

(52) U.S. Cl.
CPC ........... *C08G 61/12* (2013.01); *H10K 85/631* (2023.02); *H10K 50/11* (2023.02); *H10K 50/15* (2023.02); *H10K 50/17* (2023.02); *H10K 50/18* (2023.02)

(58) Field of Classification Search
None
See application file for complete search history.

(56) References Cited

U.S. PATENT DOCUMENTS

| 7,651,746 B2 | 1/2010 | Hudack et al. |
| 2004/0038459 A1 | 2/2004 | Brown et al. |

(Continued)

FOREIGN PATENT DOCUMENTS

| GB | 2505377 A | 2/2014 |
| JP | 2007-119763 A | 5/2007 |

(Continued)

OTHER PUBLICATIONS

International Search Report, issued in PCT/JP2019/026149, dated Sep. 10, 2019.

*Primary Examiner* — Gregory D Clark
(74) *Attorney, Agent, or Firm* — Birch, Stewart, Kolasch & Birch, LLP

(57) ABSTRACT

It is an object of the present invention to provide a high molecular weight compound that has excellent hole injection and transport performance, is capable of blocking electrons, and is highly stable as a thin film. It is another object of the present invention to provide an organic EL element that includes an organic layer (thin film) made of the above-described high molecular weight compound, wherein the (Continued)

organic EL element has high light emission efficiency and a long lifespan. The high molecular weight compound according to the present invention includes a repeating unit represented by a general formula (3), that is constituted by a specific triarylamine structural unit and a specific bonding structural unit, and has a weight average molecular weight of 10,000 or more and less than 1,000,000 on a polystyrene basis.

12 Claims, 9 Drawing Sheets

(51) Int. Cl.
*H10K 85/60* (2023.01)
*H10K 50/11* (2023.01)
*H10K 50/15* (2023.01)
*H10K 50/17* (2023.01)
*H10K 50/18* (2023.01)

(56) References Cited

U.S. PATENT DOCUMENTS

| | | |
|---|---|---|
| 2008/0274303 A1 | 11/2008 | Agata et al. |
| 2010/0176377 A1 | 7/2010 | Fukushima et al. |
| 2011/0017983 A1 | 1/2011 | Mizuki et al. |
| 2011/0042661 A1 | 2/2011 | Endo et al. |
| 2012/0305852 A1 | 12/2012 | Anémian et al. |
| 2015/0274890 A1 | 10/2015 | Kamtekar et al. |
| 2017/0253795 A1 | 9/2017 | Yoshioka et al. |
| 2019/0214569 A1 | 7/2019 | Sasada et al. |
| 2019/0326515 A1 | 10/2019 | Togashi et al. |

FOREIGN PATENT DOCUMENTS

| | | | | |
|---|---|---|---|---|
| JP | 2007-177225 A | | 7/2007 | |
| JP | 2010-062442 | * | 3/2010 | ............ H01L 51/50 |
| JP | 2010-62442 A | | 3/2010 | |
| JP | 2012-92181 A | | 5/2012 | |
| JP | 2014-1399 A | | 1/2014 | |
| JP | 2018-61028 A | | 4/2018 | |
| JP | 2018-61030 A | | 4/2018 | |
| WO | WO 99/54385 A1 | | 10/1999 | |
| WO | WO 02/45184 A1 | | 6/2002 | |
| WO | WO 2005/059951 A2 | | 6/2005 | |
| WO | WO 2009/102027 A1 | | 8/2009 | |
| WO | WO 2011/098205 A1 | | 8/2011 | |
| WO | WO 2012/153083 A1 | | 11/2012 | |
| WO | WO 2016/031639 A1 | | 3/2016 | |
| WO | WO 2018/062278 A1 | | 4/2018 | |
| WO | WO 2018/101331 A1 | | 6/2018 | |

* cited by examiner (Structural Unit 12)

(Structural Unit 17)

(Structural Unit 13)

(Structural Unit 18)

(Structural Unit 14)

(Structural Unit 19)

(Structural Unit 15)

(Structural Unit 20)

(Structural Unit 16)

(Structural Unit 21)

HIGH MOLECULAR WEIGHT TRIARYLAMINE COMPOUND COMPRISING TERPHENYL STRUCTURE IN MOLECULAR MAIN CHAIN AND ORGANIC ELECTROLUMINESCENT ELEMENT COMPRISING SAID HIGH MOLECULAR WEIGHT COMPOUND

TECHNICAL FIELD

The present invention relates to a high molecular weight compound that is suitable for use in an organic electroluminescent element (organic EL element) that is a self-emissive element that is preferably used in various types of display apparatuses, and the organic electroluminescent element.

BACKGROUND ART

Active studies have been carried out on organic EL elements that are self-emissive elements and thus are brighter than liquid crystal elements, have excellent display viewability, and can provide a clear display.

An organic EL element has a configuration in which a thin film (organic layer) made of an organic compound is interposed between an anode and a cathode. The method for forming the thin film can be roughly classified into a vacuum deposition method and a coating method. The vacuum deposition method is a method in which a thin film is formed on a substrate in vacuum using mainly a low molecular compound, and is a technique that is already in practical use. On the other hand, the coating method is a method in which a thin film is formed on a substrate through inkjet printing or printing using a solution composed mainly of a polymer. This method is a technique that is essential for future large area organic EL displays because it has high material usage efficiency and is suitable for larger area and higher resolution displays.

The vacuum deposition method in which a low molecular material is used has very low material usage efficiency. Accordingly, if the vacuum deposition method is used to produce a large substrate, there may be significant warping of a shadow mask, which makes it difficult to deposit a uniform thin film on a large substrate. There is also the issue of the production cost being high.

On the other hand, with a polymer material, a uniform film can be formed even on a large substrate by applying a solution prepared by dissolving the polymer material in an organic solvent. Thus, a coating method as typified by an inkjet printing method or a printing method can be used. Accordingly, the material usage efficiency can be increased, and thus the cost of producing elements can be reduced significantly.

Various studies have been conducted on organic EL elements in which a polymer material is used. However, there is still a problem in that the element characteristics such as light emission efficiency and lifespan are not necessarily sufficient (see, for example, Patent Literatures 1 to 5).

Also, a fluorene polymer called TFB is known as a typical hole transport material that has been used in organic EL polymer elements (see Patent Literatures 6 and 7). However, TFB has insufficient hole transportability and insufficient electron blockability. Accordingly, there is a problem in that some electrons pass through a light emitting layer, and thus an improvement in light emission efficiency cannot be expected. There is also another problem in that TFB has low film adhesion to adjacent layers, and thus an increase in the lifespan of elements cannot be expected.

CITATION LIST

Patent Literatures

Patent Literature 1: US 20080274303
Patent Literature 2: JP 2007-119763A
Patent Literature 3: US 20100176377
Patent Literature 4: JP 2007-177225A
Patent Literature 5: U.S. Pat. No. 7,651,746
Patent Literature 6: WO1999/054385
Patent Literature 7: WO2005/059951

SUMMARY OF INVENTION

It is an object of the present invention to provide a polymer material that has excellent hole injection and transport performance, is capable of blocking electrons, and is highly stable as a thin film.

It is another object of the present invention to provide an organic EL element that includes an organic layer (thin film) made of the above-described polymer material, wherein the organic EL element has high light emission efficiency and a long lifespan.

The inventors of the present invention noticed that a triarylamine having a terphenyl structure in its molecular main chain has high hole injection/transport capability and is expected to realize a wide bandgap, and conducted studies by synthesizing high molecular weight triarylamine compounds including various terphenyl structural units. As a result, they found a high molecular weight compound with a novel structure that has, in addition to the hole injection/transport capability, a wide bandgap, excellent heat resistance, and thin film stability. The present invention has thereby been accomplished.

The present invention provides a high molecular weight compound including a repeating unit represented by a general formula (3) below which is constituted by a triarylamine structural unit represented by a general formula (1) below and a bonding structural unit represented by a general formula (2) below.

The present invention further provides an organic EL element having a pair of electrodes and at least one organic layer interposed therebetween, the at least one organic layer containing the above-described high molecular weight compound as a constituent material.

In the organic EL element according to the present invention, it is preferable that the organic layer is a hole transport layer, an electron blocking layer, a hole injection layer, or a light emitting layer.

That is to say, the present invention is as follows.

[1] A high molecular weight compound including a repeating unit represented by a general formula (3) below, that is constituted by a triarylamine structural unit represented by a general formula (1) below and a bonding structural unit represented by a general formula (2) below, and having a weight average molecular weight of 10,000 or more and less than 1,000,000 on a polystyrene basis,

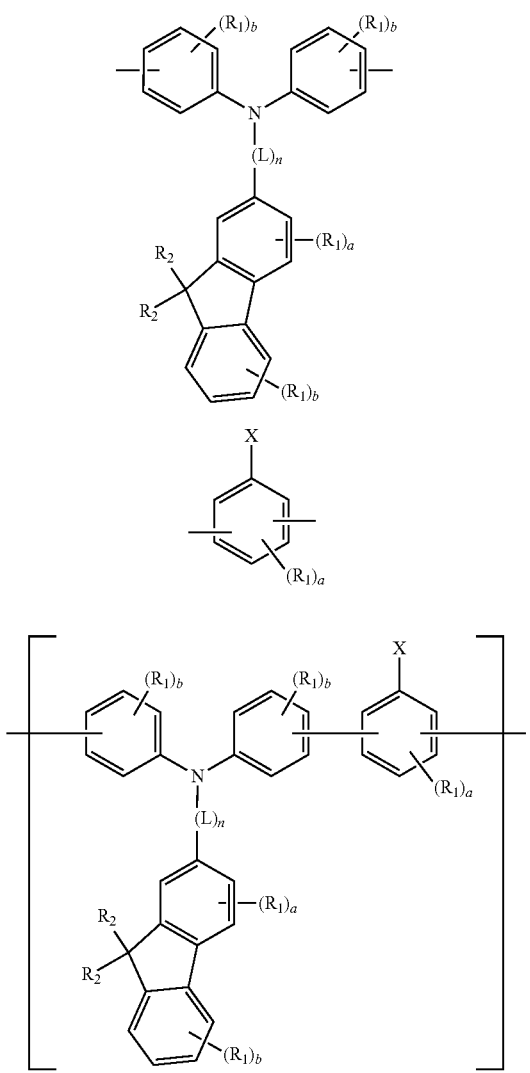

where $R_1$ each independently represents a hydrogen atom, a heavy hydrogen atom, a cyano group, a nitro group, a fluorine atom, a chlorine atom, a bromine atom, an iodine atom, an alkyl group or an alkyloxy group with 1 to 8 carbon atoms, a cycloalkyl group or a cycloalkyloxy group with 5 to 10 carbon atoms, an alkenyl group with 2 to 6 carbon atoms, or an aryloxy group, $R_2$ each independently represents an alkyl group or an alkyloxy group with 1 to 8 carbon atoms, or a cycloalkyl group or a cycloalkyloxy group with 5 to 10 carbon atoms, X represents a hydrogen atom, an amino group, a monovalent aryl group, or a monovalent heteroaryl group, L represents a divalent phenyl group, and n represents an integer of 0 to 3, and a represents an integer of 0 to 3, and b represents an integer of 0 to 4.

[2] The high molecular weight compound as set forth in [1], wherein $R_1$ is a hydrogen atom.

[3] The high molecular weight compound as set forth in [1] or [2], wherein $R_2$ is an alkyl group with 1 to 8 carbon atoms.

[4] The high molecular weight compound as set forth in any one of [1] to [3], wherein X is a hydrogen atom.

[5] The high molecular weight compound as set forth in any one of [1] to [3], wherein X is a diphenylamino group, a phenyl group, a naphthyl group, a dibenzofuranyl group, a dibenzothienyl group, a phenanthrenyl group, a fluorenyl group, a carbazolyl group, an indenocarbazolyl group, or an acridinyl group.

[6] The high molecular weight compound as set forth in any one of [1] to [5], further including a repeating unit which is constituted by a thermal crosslinkable structural unit and the bonding structural unit represented by the general formula (2) above.

[7] The high molecular weight compound as set forth in [6], wherein the thermal crosslinkable structural unit is a structural unit represented by general formulae (4a) to (4z) in the diagrams, which will be shown later.

[8] The high molecular weight compound as set forth in any one of [1] to [5], further including a repeating unit which is constituted by a triarylamine structural unit that is different from those represented by the general formula (1) above and the bonding structural unit represented by the general formula (2) above.

[9] An organic electroluminescent element having a pair of electrodes and at least one organic layer interposed therebetween, the at least one organic layer containing the high molecular weight compound as set forth in any one of [1] to [8] as a constituent material.

[10] The organic electroluminescent element as set forth in [9], wherein the organic layer is a hole transport layer.

[11] The organic electroluminescent element as set forth in [9], wherein the organic layer is an electron blocking layer.

[12] The organic electroluminescent element as set forth in [9], wherein the organic layer is a hole injection layer.

[13] The organic electroluminescent element as set forth in [9], wherein the organic layer is a light emitting layer.

Advantageous Effects of Invention

The high molecular weight compound according to the present invention that includes the triarylamine structural unit (divalent group) represented by the general formula (1) above and the bonding structural unit (divalent group) represented by the general formula (2) is, for example, a polymer that includes the structural unit as a repeating unit, and preferably has a weight average molecular weight of 10,000 or more and less than 1,000,000 on a polystyrene basis measured using GPC (gel permeation chromatography).

The high molecular weight compound has the following characteristics:
(1) good hole injectionability;
(2) high hole mobility;
(3) wide bandgap, and excellent electron blocking capability;
(4) good thin film stability; and
(5) excellent heat resistance.

An organic EL element in which an organic layer made of the high molecular weight compound described above such as, for example, a hole transport layer, an electron blocking layer, a hole injection layer, or a light emitting layer is formed between a pair of electrodes has the following advantages:
(1) high light emission efficiency and high power efficiency;
(2) a low actual driving voltage; and
(3) a long lifespan.

DESCRIPTION OF EMBODIMENTS

Figure 1:
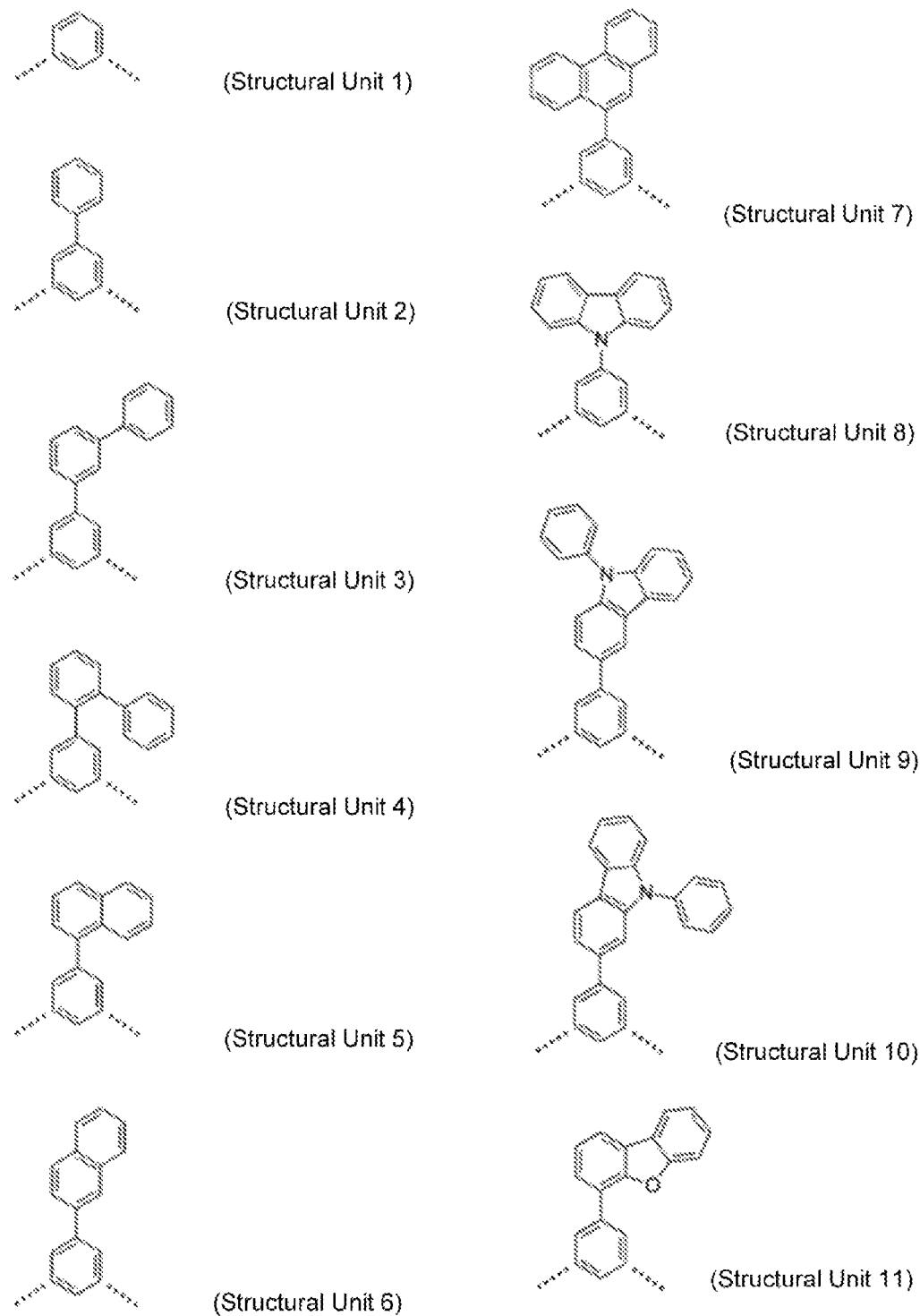
FIG. 1 A diagram showing the chemical structures of structural unit 1 to 11 preferably used as a bonding structural unit represented by the general formula (2) included in the high molecular weight compound according to the present invention.

<Triarylamine Structural Unit and Bonding Structural Unit>

Both of a triarylamine structural unit and a bonding structural unit included in the high molecular weight compound according to the present invention are divalent groups, and are respectively represented by general formulae (1) and (2) below.

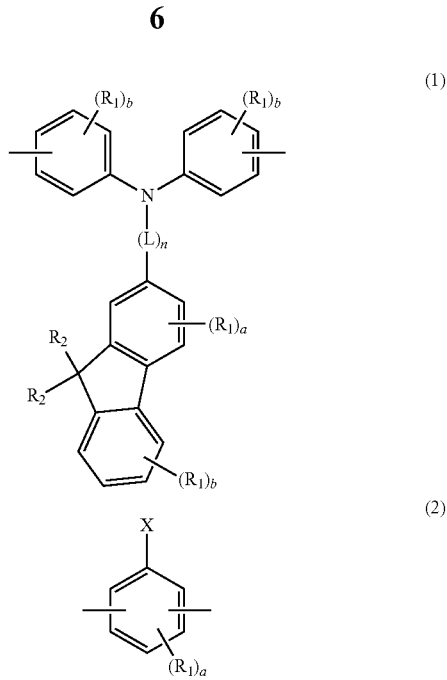

In the general formulae (1) and (2) above, $R_1$ each independently represents a hydrogen atom, a heavy hydrogen atom, a cyano group, a nitro group, a fluorine atom, a chlorine atom, a bromine atom, an iodine atom, an alkyl group or an alkyloxy group with 1 to 8 carbon atoms, a cycloalkyl group or a cycloalkyloxy group with 5 to 10 carbon atoms, an alkenyl group with 2 to 6 carbon atoms, or an aryloxy group.

In the above-described $R_1$, examples of the alkyl group, the alkyloxy group, the cycloalkyl group, the cycloalkyloxy group, the alkenyl group, and the aryloxy group described above include the following groups:

alkyl groups (with 1 to 8 carbon atoms);
    a methyl group, an ethyl group, an n-propyl group, an isopropyl group, an n-butyl group, an isobutyl group, a tert-butyl group, an n-pentyl group, an isopentyl group, a neopentyl group, an n-hexyl group, an isohexyl group, a neohexyl group, an n-heptyl group, an isoheptyl group, a neoheptyl group, an n-octyl group, an isooctyl group, a neooctyl group, etc.:

alkyloxy groups (with 1 to 8 carbon atoms);
    a methyloxy group, an ethyloxy group, an n-propyloxy group, an isopropyloxy group, an n-butyloxy group, a tert-butyloxy group, an n-pentyloxy group, an n-hexyloxy group, an n-heptyloxy group, an n-octyloxy group, etc.:

cycloalkyl groups (with 5 to 10 carbon atoms);
    a cyclopentyl group, a cyclohexyl group, a 1-adamantyl group, a 2-adamantyl group, etc.:

cycloalkyloxy groups (with 5 to 10 carbon atoms);
    a cyclopentyloxy group, a cyclohexyloxy group, a cycloheptyloxy group, a cyclooctyloxy group, a 1-adamantyloxy group, a 2-adamantyloxy group, etc.:

alkenyl groups (with 2 to 6 carbon atoms);
    a vinyl group, an allyl group, an isopropenyl group, a 2-butenyl group, etc.: and aryloxy groups;
    a phenyloxy group, a tolyloxy group, etc.

In the high molecular weight compound according to the present invention, the above-described $R_1$ is preferably a hydrogen atom or a heavy hydrogen atom, and more preferably a hydrogen atom in view of synthesizing.

In the general formula (1) above, $R_2$ each independently represents an alkyl group or an alkyloxy group with 1 to 8 carbon atoms, or a cycloalkyl group or a cycloalkyloxy group with 5 to 10 carbon atoms.

In the above-described $R_2$, examples of the alkyl group, the alkyloxy group, the cycloalkyl group, and the cycloalkyloxy group described above include groups that are similar to those represented by $R_1$.

In the high molecular weight compound according to the present invention, the above-described $R_2$ is preferably an alkyl group with 1 to 8 carbon atoms, and more preferably an n-hexyl group or an n-octyl group, in view of enhancing the solubility.

In the general formulae (1) and (2) above, a represents an integer of 0 to 3, and b represents an integer of 0 to 4.

In the general formula (2) above, X represents a hydrogen atom, an amino group, a monovalent aryl group, or a monovalent heteroaryl group.

About the above-described X, examples of the monovalent aryl group and the monovalent heteroaryl group include the following groups:

aryl groups;
  a phenyl group, a naphthyl group, an anthracenyl group, a phenanthrenyl group, a fluorenyl group, an indenyl group, a pyrenyl group, a perylenyl group, a fluoranthenyl group, etc.: and heteroaryl groups;
  a pyridyl group, a pyrimidinyl group, a triazinyl group, a furyl group, a pyrrolyl group, a thienyl group, a quinolyl group, an isoquinolyl group, a benzofuranyl group, a benzothienyl group, an indolyl group, a carbazolyl group, an indenocarbazolyl group, a benzooxazolyl group, a benzothiazolyl group, a quinoxalinyl group, a benzimidazolyl group, a pyrazolyl group, a dibenzofuranyl group, a dibenzothienyl group, a naphthyridinyl group, a phenanthrolinyl group, an acridinyl group, a carbolinyl group, etc.

Furthermore, the amino group, the aryl group, and the heteroaryl group described above may have a substituent group. Examples of the substituent group include, in addition to a heavy hydrogen atom, a cyano group, a nitro group, and the like, the following groups:

halogen atoms, for example, a fluorine atom, a chlorine atom, a bromine atom, and an iodine atom;
alkyl groups, in particular those with 1 to 8 carbon atoms, for example, a methyl group, an ethyl group, an n-propyl group, an isopropyl group, an n-butyl group, an isobutyl group, a tert-butyl group, an n-pentyl group, an isopentyl group, a neopentyl group, an n-hexyl group, an isohexyl group, a neohexyl group, an n-heptyl group, an isoheptyl group, a neoheptyl group, an n-octyl group, an isooctyl group, and a neooctyl group;
alkyloxy groups, in particular those with 1 to 8 carbon atoms, for example, a methyloxy group, an ethyloxy group, and a propyloxy group;
alkenyl groups, for example, a vinyl group, and an allyl group;
aryloxy groups, for example, a phenyloxy group, and a tolyloxy group;
aryl groups, for example, a phenyl group, a biphenylyl group, a terphenylyl group, a naphthyl group, an anthracenyl group, a phenanthrenyl group, a fluorenyl group, an indenyl group, a pyrenyl group, a perylenyl group, a fluoranthenyl group, and a triphenylenyl group;
heteroaryl groups, for example, a pyridyl group, a pyrimidinyl group, a triazinyl group, a thienyl group, a furyl group, a pyrrolyl group, a quinolyl group, an isoquinolyl group, a benzofuranyl group, a benzothienyl group, an indolyl group, a carbazolyl group, an indenocarbazolyl group, a benzooxazolyl group, a benzothiazolyl group, a quinoxalinyl group, a benzimidazolyl group, a pyrazolyl group, a dibenzofuranyl group, a dibenzothienyl group, and a carbolinyl group;
aryl vinyl groups, for example, a styryl group, and a naphthyl vinyl group; and
acyl groups, for example, an acetyl group, a benzoyl group, etc.

The substituent groups listed above may further have any of the substituent groups listed above.

Furthermore, it is preferable that these substituent groups are each independently present. However, these substituent groups may be bonded to each other to form a ring via a single bond, a methylene group that may have a substituent group, an oxygen atom, or a sulfur atom.

For example, the aryl group and the heteroaryl group described above may have a phenyl group as a substituent group. The phenyl group may further have a phenyl group as a substituent group. That is, in the case of an aryl group, the aryl group may be a biphenylyl group, a terphenylyl group, or a triphenylenyl group.

In the general formula (1) above, L represents a divalent phenyl group, and n represents an integer of 0 to 3.

Furthermore, the above-described L may have a substituent group. Examples of the substituent group include groups that are similar to the substituent groups that can be included in the above-described X, and these substituent groups may further have a substituent group.

Figure 2:
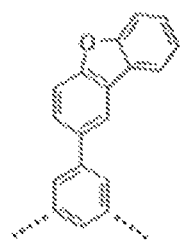
FIG. 2 A diagram showing the chemical structures of structural unit 12 to 21 preferably used as a bonding structural unit represented by the general formula (2) included in the high molecular weight compound according to the present invention.
Figure 2:
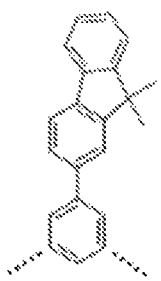
Figure 2:
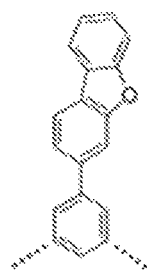
Figure 2:
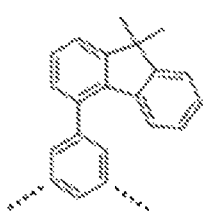
Figure 2:
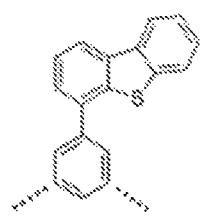
Figure 2:
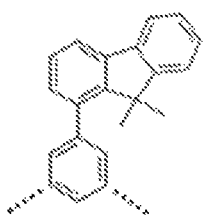
Figure 2:
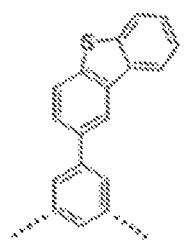
Figure 2:
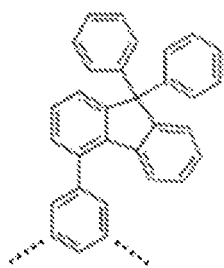
Figure 2:
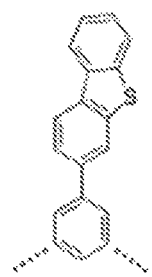
Figure 2:
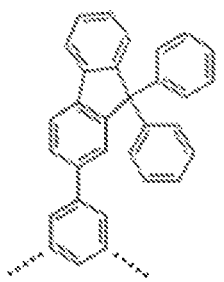
Figure 3:
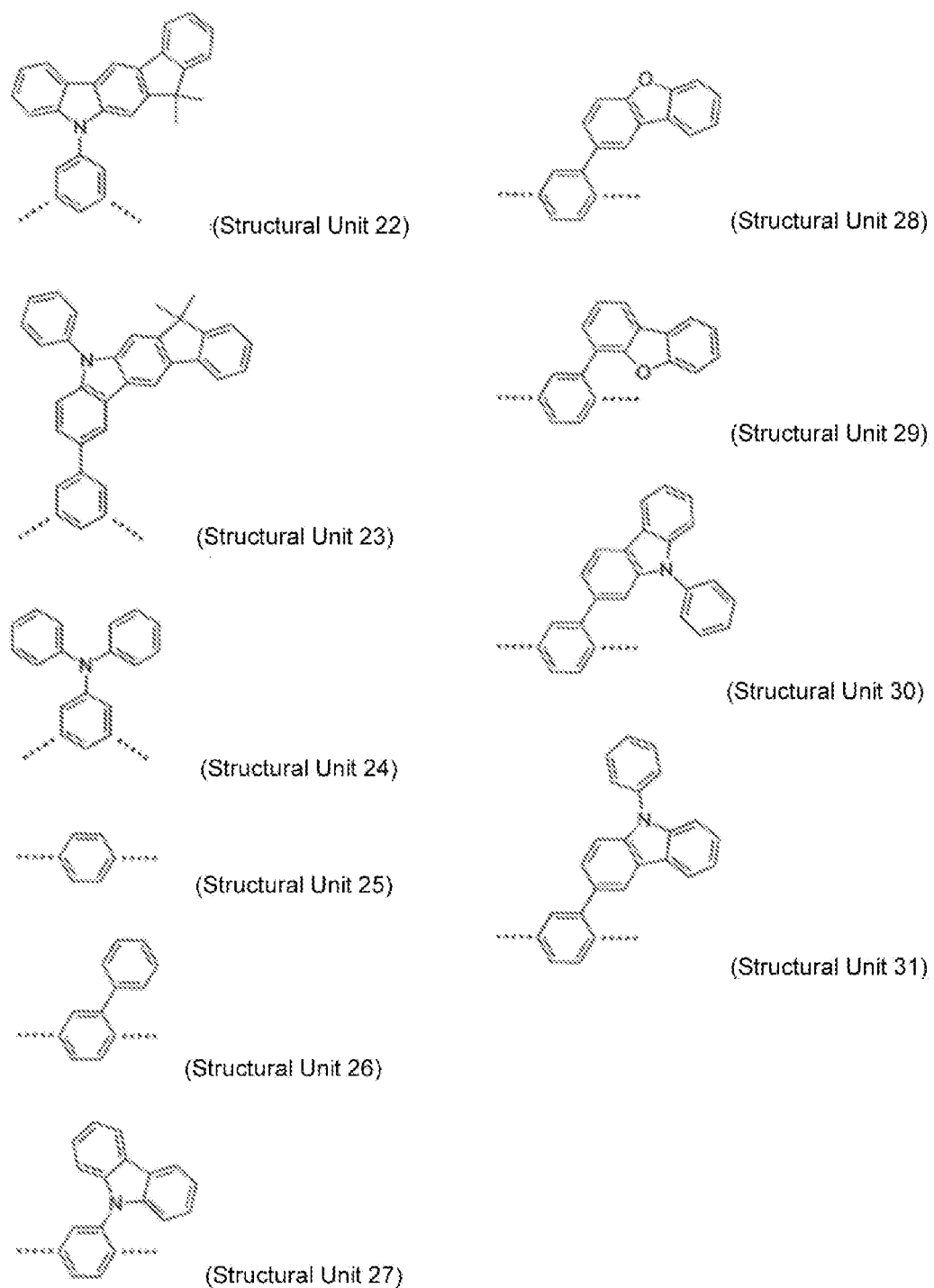
FIG. 3 A diagram showing the chemical structures of structural unit 22 to 31 preferably used as a bonding structural unit represented by the general formula (2) included in the high molecular weight compound according to the present invention.

Specific examples of the bonding structural unit represented by the general formula (2) of the present invention are shown as structural unit 1 to 31 in FIG. 1 to 3. In the chemical formulae shown in FIG. 1 to 3, each broken line indicates a bond to an adjacent structural unit, and each solid line that extends from a ring and has a free end indicates that the free end is a methyl group. Although specific examples preferably used as a bonding structural unit are shown, the bonding structural unit used in the present invention is not limited to these structural units.

<High Molecular Weight Compound>

As already described above, the high molecular weight compound according to the present invention including the repeating unit represented by the general formula (3) which is constituted by the triarylamine structural unit represented by the general formula (1) above and the bonding structural unit represented by the general formula (2), has excellent characteristics such as hole injection characteristics, hole mobility, electron blocking capability, thin film stability, and heat resistance. From the viewpoint of enhancing the characteristics and ensuring film formability, the high molecular weight compound has, for example, a weight average molecular weight on a polystyrene basis measured using GPC, preferably in a range of 10,000 or more and less than 1,000,000, more preferably in a range of 10,000 or more and less than 500,000, and even more preferably in a range of 10,000 or more and less than 200,000.

Also, in order to ensure coatability, adhesion to other layers, and durability when the high molecular weight compound according to the present invention is used to form, for example, an organic layer in an organic EL element through coating, the high molecular weight compound is preferably a copolymer of the above-described structural unit and another structural unit. The other structural unit may be, for example, a thermal crosslinkable structural unit, and a triarylamine structural unit that is different from that represented by the general formula (1).

Figure 4:
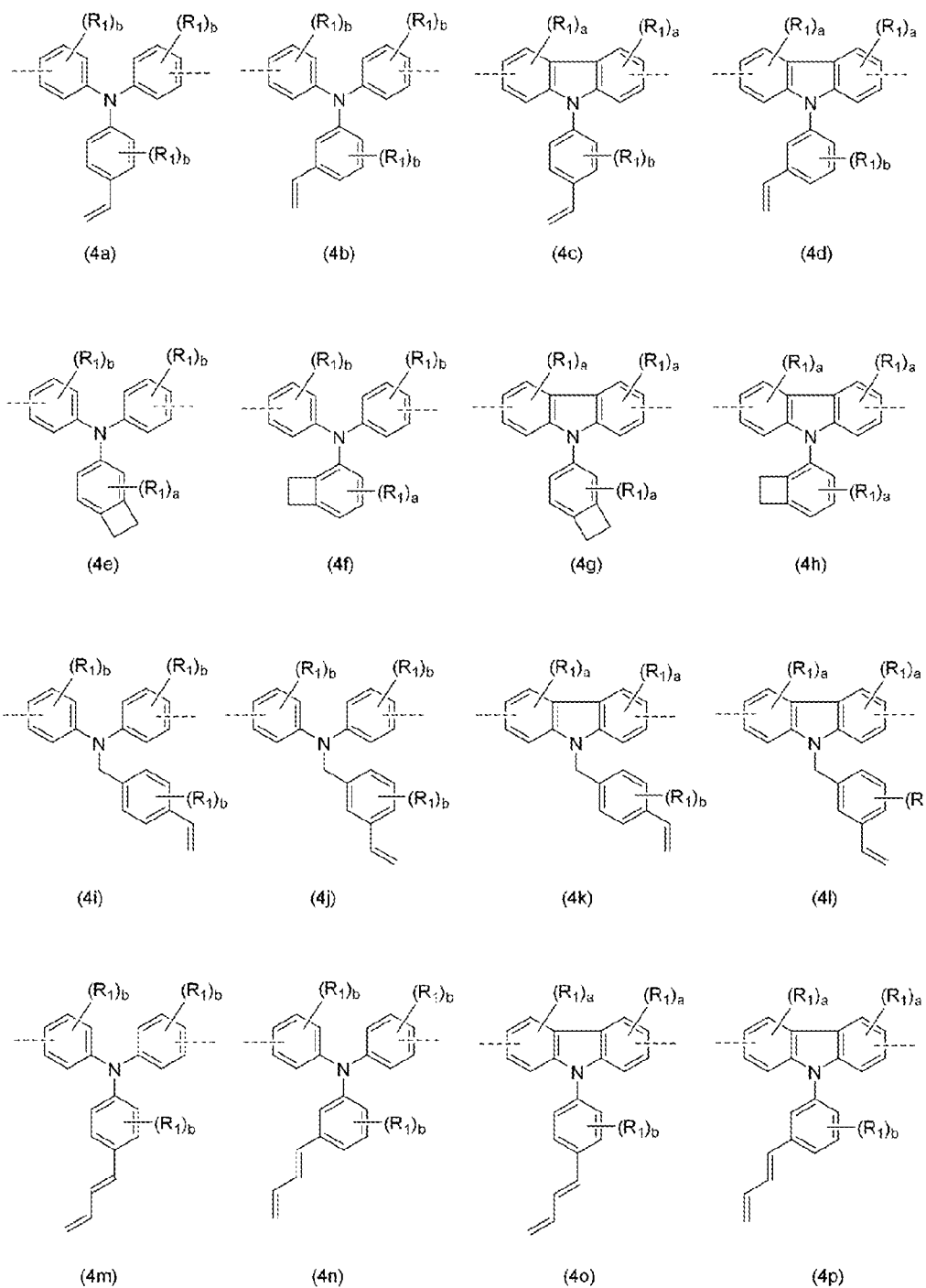
FIG. 4 A diagram showing the chemical structures of thermal crosslinkable structural unit (4a) to (4p).
Figure 5:
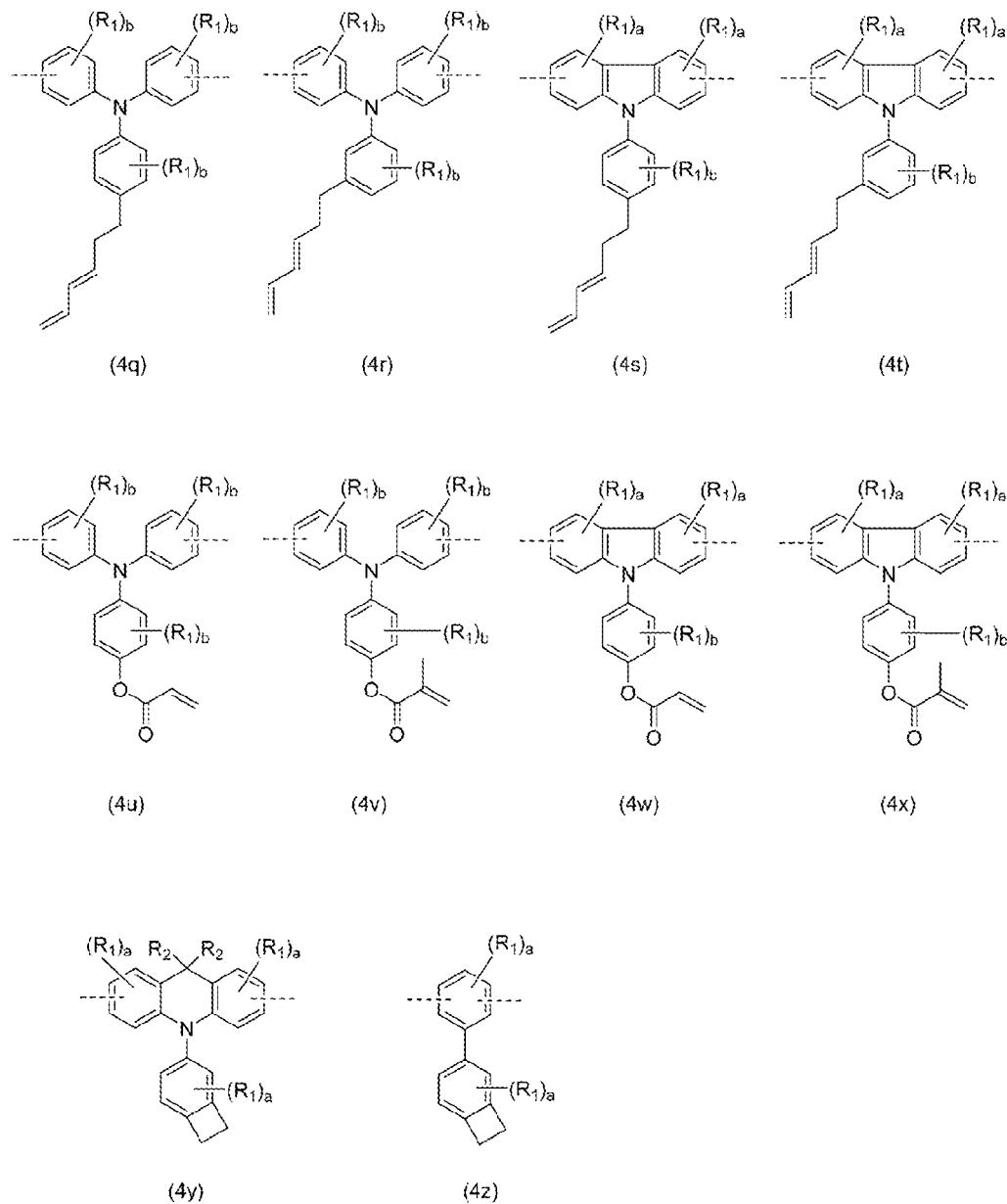
FIG. 5 A diagram showing the chemical structures of thermal crosslinkable structural unit (4q) to (4z).

The thermal crosslinkable structural unit is a structural unit having a reactive functional group such as a vinyl group or a cyclobutane ring therein, and specific examples are shown as formulae (4a) to (4z) in FIGS. 4 and 5. Although they are specific examples preferably used as a thermal crosslinkable structural unit, the thermal crosslinkable structural unit used in the present invention is not limited to these structural units.

In the formulae (4a) to (4z), each broken line indicates a bond to an adjacent structural unit, and each solid line that extends from a ring and has a free end indicates that the free end is a methyl group.

Also, in the formulae, all of $R_1$, $R_2$, a, and b are the same as those represented by the general formula (1).

The other structural unit such as a thermal crosslinkable structural unit or a triarylamine structural unit that is different from that represented by the general formula (1) may be contained alone in the high molecular weight compound according to the present invention, or may be contained in the high molecular weight compound according to the present invention in combination with the above-described bonding structural unit represented by the general formula (2) to form a repeating unit.

In the high molecular weight compound according to the present invention, if the structural unit represented by the general formula (1) is denoted by A, the bonding structural unit represented by the general formula (2) is denoted by B, and the thermal crosslinkable structural unit or the triarylamine structural unit that is different from that represented by the general formula (1) is denoted by C, the amount of structural unit A is preferably 1 mol % or more, and more preferably 20 mol % or more. On the condition that the high molecular weight compound according to the present invention includes the structural unit A in the above-described amount, the high molecular weight compound includes the structural unit B in an amount of preferably 1 mol % or more, and more preferably 30 to 70 mol %, and the structural unit C in an amount of preferably 1 mol % or more, and more preferably 5 to 20 mol %. From the viewpoint of forming an organic layer in the organic EL element, it is even more preferable that the high molecular weight compound according to the present invention is a terpolymer that includes the structural units A, B, and C so as to satisfy the above conditions.

The high molecular weight compound according to the present invention described above can be synthesized by forming C—C bonds or C—N bonds through a Suzuki polymerization reaction or a HARTWIG-BUCHWALD polymerization reaction so as to connect the structural units. Specifically, the high molecular weight compound according to the present invention can be synthesized by preparing unit compounds that respectively have the above-described structural units, and subjecting the unit compounds to borate esterification or halogenation as appropriate and then to a polycondensation reaction using an appropriate catalyst.

For example, as the compound for introducing the structural unit represented by the general formula (1), a triarylamine derivative represented by the following general formula (1a) can be used.

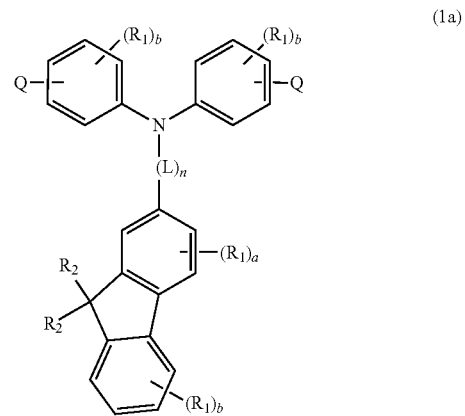

(1a)

In formula (1a), Q is a hydrogen atom, a halogen atom, or a borate ester group, and all of $R_1$, $R_2$, and L are the same as those represented by the general formula (1).

That is, in the general formula (1a) given above, in the case where Q is a hydrogen atom, the unit compound for introducing the structural unit represented by the general formula (1) is obtained. In the case where Q is a halogen atom or a borate ester group, a halide or a borate ester used to synthesize a polymer is obtained. The halogen atom is preferably Br.

For example, a copolymer containing 40 mol % of the structural unit A represented by the general formula (1), 50 mol % of the structural unit B represented by the general formula (2), and 10 mol % of the thermal crosslinkable structural unit C (the formula (4e) in FIG. 4) is represented by a general formula (5) below.

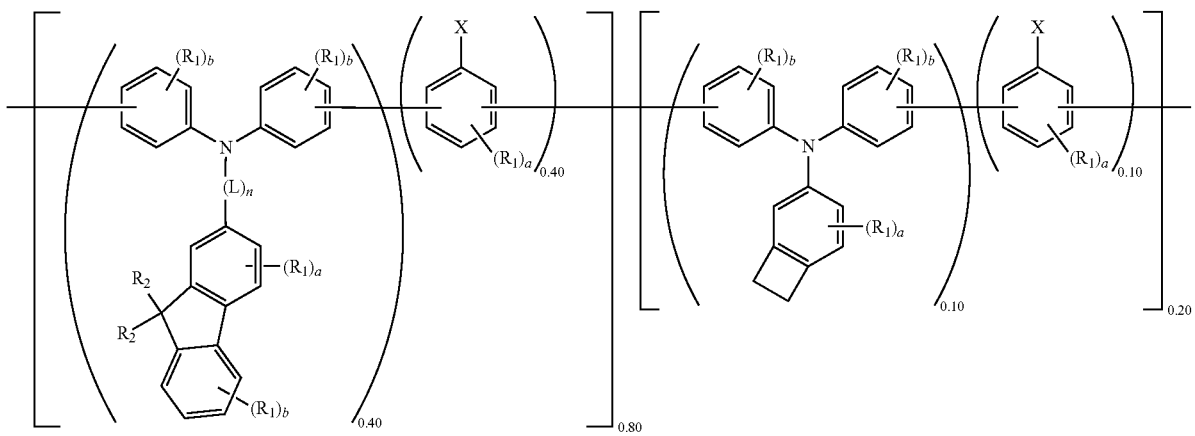

This high molecular weight compound can be synthesized through a polycondensation reaction of a borate ester and a halide. It is necessary that an intermediate for introducing the structural unit A and the structural unit C is a borate ester, whereas an intermediate for introducing the structural unit B is a halide, or that an intermediate for introducing the structural unit A and the structural unit C is a halide, whereas an intermediate for introducing the structural unit B is a borate ester. That is to say, the halide and the borate ester have an equal molar ratio.

The high molecular weight compound according to the present invention described above is dissolved in an aromatic organic solvent such as benzene, toluene, xylene, or anisole so as to prepare a coating solution, and the coating solution is applied to a predetermined substrate to form a coating, and then the coating is heated and dried. In this way, a thin film that has excellent characteristics such as hole injectionability, hole transportability, and electron blockability can be formed. The thin film also has good heat resistance and good adhesion to other layers.

The high molecular weight compound described above can be used as a constituent material of a hole injection layer and/or a hole transport layer included in an organic EL element. The hole injection layer or the hole transport layer formed using the high molecular weight compound described above has higher hole injectionability, greater mobility, and higher electron blockability than the hole injection layer or the hole transport layer formed using a conventional material. Furthermore, the hole injection layer or the hole transport layer formed using the high molecular weight compound described above can confine excitons generated in a light emitting layer, improve the probability of recombination of holes and electrons, and provide high light emission efficiency, and at the same time, achieve advantages of reducing the driving voltage and improving the durability of the organic EL element.

Also, the high molecular weight compound according to the present invention having the electrical characteristics described above has a bandgap that is wider than that of conventional materials, and is effective to confine excitons, and thus it can also be preferably used as an electron blocking layer or a light emitting layer.

<Organic EL Element>

An organic EL element that includes an organic layer formed using the high molecular weight compound according to the present invention described above has, for example, a structure shown in FIG. 6. Specifically, a transparent anode 2, a hole injection layer 3, a hole transport layer 4, a light emitting layer 5, an electron transport layer 6, and a cathode 7 are formed on a glass substrate 1 (which may be a transparent substrate such as a transparent resin substrate).

Of course, the layer structure of the organic EL element to which the high molecular weight compound according to the present invention is applied is not limited to that described above. A hole blocking layer may be formed between the light emitting layer 5 and the electron transport layer 6. Also, an electron blocking layer or the like may be formed between a hole transport layer 11 and a light emitting layer 13 as in the structure shown in FIG. 7. Furthermore, an electron injection layer may be formed between the cathode 7 and the electron transport layer 6. Furthermore, some layers may be omitted. For example, the organic EL element may have a simple layer structure in which an anode 2, a hole transport layer 4, a light emitting layer 5, an electron transport layer 6, and a cathode 7 are formed on a substrate 1. A double-layer structure may be used in which layers having the same function are overlaid.

Taking advantage of characteristics such as hole injectionability and hole transportability, the high molecular weight compound according to the present invention is preferably used as a material for forming an organic layer (for example, a hole injection layer 3, a hole transport layer 4, a light emitting layer 5, or an electron blocking layer) that is formed between the anode 2 and the cathode 7.

In the organic EL element described above, the transparent anode 2 may be made of an electrode material that is known per se, and is formed by depositing an electrode material that has a large work function, such as ITO or gold, on a substrate 1 (a transparent substrate such as a glass substrate).

Also, the hole injection layer 3 formed on the transparent anode 2 can be formed using a coating solution prepared by dissolving the high molecular weight compound according to the present invention in, for example, an aromatic organic solvent such as toluene, xylene, or anisole. That is, the hole injection layer 3 can be formed by applying the coating solution to the transparent anode 2 through spin coating, inkjet printing, or the like so as to form a coating.

Furthermore, in the organic EL element including the organic layer formed using the high molecular weight compound according to the present invention, the hole injection layer 3 can also be formed using a conventionally known material, without using the high molecular weight compound according to the present invention. Examples of the conventionally known material include:

a porphyrin compound as typified by copper phthalocyanine;

a star burst triphenylamine derivative;

an arylamine having a structure in which molecules are connected via a single bond or a divalent group that does not have a hetero atom (for example, a triphenylamine trimer or tetramer);

an acceptor-like heterocyclic ring compound such as hexacyanoazatriphenylene; and a coating polymer material such as, for example, poly(3, 4-ethylenedioxythiophene) (PEDOT), or poly(styrenesulfonate) (PSS).

A layer (thin film) made of any of the materials listed above can be formed through coating using a deposition method, a spin-coating method, an inkjet printing method, or the like. The same applies to other layers. Film-forming is performed using a deposition method or a coating method according to the type of film-forming material.

As with the hole injection layer 3, the hole transport layer 4 formed on the hole injection layer 3 can also be formed through coating such as spin-coating or inkjet printing using the high molecular weight compound according to the present invention.

Furthermore, in the organic EL element including the organic layer formed using the high molecular weight compound according to the present invention, the hole transport layer 4 can also be formed using a conventionally known hole transport material. Typical examples of the hole transport material include:

benzidine derivatives such as N,N'-diphenyl-N,N'-di(m-tolyl)benzidine (hereinafter referred to simply as TPD), N,N'-diphenyl-N,N'-di((α-naphthyl)benzidine (hereinafter referred to simply as NPD), and N,N,N',N'-tetrabiphenylyl benzidine;

amine derivatives such as 1,1-bis[4-(di-4-tolylamino)phenyl]cyclohexane (hereinafter referred to simply as TAPC);

various types of triphenylamine trimers and tetramer;

coating polymer materials that are also used to form a hole injection layer; and the like.

The compounds for forming a hole transport layer, including the high molecular weight compound according to the present invention, may be used alone or in combination of two or more to form a hole transport layer. Alternatively, a multi-layer film in which a plurality of layers formed using one or more of the compounds listed above are stacked may be used as the hole transport layer.

Furthermore, in the organic EL element including the organic layer formed using the high molecular weight compound according to the present invention, the hole injection layer 3 and the hole transport layer 4 may be combined into one layer. Such a hole injection/transport layer can be formed through coating using a polymer material such as PEDOT.

In the hole transport layer 4 (the same applies to the hole injection layer 3), a material obtained by p-doping a material usually used to form the layer with trisbromophenylamine-hexachloroantimony, a radialene derivative (see, for example, WO 2014/009310), or the like can also be used. The hole transport layer 4 (or the hole injection layer 3) can also be formed using a polymer that has a TPD base skeleton, or the like.

Figure 7:
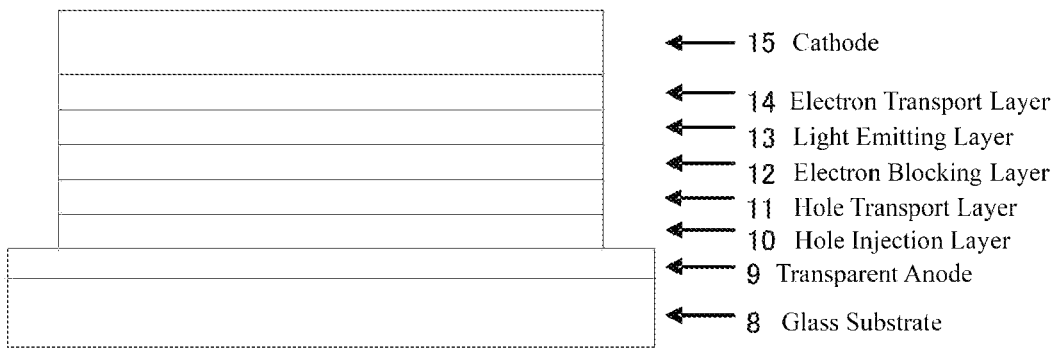
FIG. 7 A diagram showing an example of a layer configuration of the organic EL element according to the present invention.

Furthermore, an electron blocking layer (which can be provided between the hole transport layer 11 and the light emitting layer 13 as shown in FIG. 7) can also be formed through coating such as spin-coating or inkjet printing using the high molecular weight compound according to the present invention.

Furthermore, in the organic EL element including the organic layer formed using the high molecular weight compound according to the present invention, an electron blocking layer can also be formed using a known electron blocking compound that has an electron blocking function such as, for example, a carbazole derivative or a compound that has a triphenylsilyl group and a triarylamine structure. Specific examples of the carbazole derivative and the compound that has a triarylamine structure are as follows.

Examples of the carbazole derivative include:
4,4',4"-tri(N-carbazolyl)triphenylamine (hereinafter referred to simply as TCTA);
9,9-bis[4-(carbazole-9-yl)phenyl]fluorene;
1,3-bis(carbazole-9-yl)benzene (hereinafter referred to simply as mCP); and
2,2-bis(4-carbazole-9-ylphenyl)adamantane (hereinafter referred to simply as Ad-Cz).

Examples of the compound that has a triarylamine structure include 9-[4-(carbazole-9-yl)phenyl]-9-[4-(triphenylsilyl)phenyl]-9H-fluorene.

The electron blocking layer, containing the high molecular weight compound according to the present invention, may be used alone or in combination of two or more to form an electron blocking layer. Alternatively, a multi-layer film in which a plurality of layers formed using one or more of the compounds listed above are stacked may be used as the electron blocking layer.

In the organic EL element including the organic layer formed using the high molecular weight compound according to the present invention, the light emitting layer 5 can be formed using a light emitting material such as a metal complex of a quinolinol derivative such as $Alq_3$. Other examples of the light emitting material include various types of metal complexes of zinc, beryllium, aluminum and the like, an anthracene derivative, a bisstyrylbenzene derivative, a pyrene derivative, an oxazole derivative, and a polyphenylene vinylene derivative.

Also, the light emitting layer 5 can also be formed using a host material and a dopant material. In this case, as the host material, in addition to the light emitting materials listed above, a thiazole derivative, a benzimidazole derivative, a polydialkylfluorene derivative, and the like can be used. Furthermore, the high molecular weight compound according to the present invention described above can also be used. As the dopant material, quinacridone, coumarin, rubrene, perylene, and derivatives thereof, a benzopyran derivative, a rhodamine derivative, an aminostyryl derivative, and the like can be used.

The light emitting layer 5 described above may have a single-layer structure in which one or more of the light emitting materials listed above is used, or a multi-layer structure in which a plurality of layers are stacked.

Furthermore, the light emitting layer 5 can also be formed using a phosphorescent light emitting material as the light emitting material. As the phosphorescent light emitting material, a phosphorescent emitter of a metal complex of iridium, platinum, or the like can be used. For example, a green phosphorescent emitter such as $Ir(ppy)_3$, a blue phosphorescent emitter such as FIrpic or $FIr_6$, a red phosphorescent emitter such as $Btp_2Ir$ (acac), or the like can be used. The phosphorescent light emitting material is used by being doped into a host material that has hole injectionability/transportability or a host material that has electron transportability.

In order to avoid concentration quenching, it is preferable to dope the host material with the phosphorescent light emitting material through co-deposition in an amount of 1 to 30 wt % relative to the entire light emitting layer.

Also, as the light emitting material, a material that emits delayed fluorescence such as a CDCB derivative, specifically, PIC-TRZ, CC2TA, PXZ-TRZ, 4CzIPN, or the like can also be used (see Appl. Phys. Let., 98, 083302 (2011)).

The light emitting layer 5 may be formed by causing the high molecular weight compound according to the present invention to carry a fluorescent emitter or a phosphorescent emitter that is called a dopant, or a material that emits delayed fluorescence. In this way, an organic EL element that has a low driving voltage and improved light emission efficiency can be achieved.

In the organic EL element including the organic layer formed using the high molecular weight compound according to the present invention, as the host material that has hole injectionability/transportability, the high molecular weight compound according to the present invention can be used. Alternatively, a carbazole derivative such as 4,4'-di(N-carbazolyl)biphenyl (hereinafter referred to simply as CBP), TCTA, or mCP, or the like can be used.

Furthermore, in the organic EL element including the organic layer formed using the high molecular weight compound according to the present invention, as the host material that has electron transportability, p-bis(triphenylsilyl)benzene (hereinafter referred to simply as UGH2), 2,2',2"-(1,3,5-phenylene)-tris(1-phenyl-TH-benzimidazole) (hereinafter referred to simply as TPBI), or the like can be used.

In the organic EL element including the organic layer formed using the high molecular weight compound according to the present invention, the hole blocking layer (not shown in the diagram) provided between the light emitting layer 5 and the electron transport layer 6 can be formed using a hole blocking compound that is known per se.

Examples of the known hole blocking compound include:
a phenanthroline derivative such as bathocuproine (hereinafter referred to simply as BCP);

a metal complex of a quinolinol derivative such as aluminum(III)bis(2-methyl-8-quinolinate)-4-phenylphenolate (hereinafter referred to simply as BAlq);
various types of rare-earth complexes;
a triazole derivative;
a triazine derivative;
an oxadiazole derivative; and the like.

These materials can also be used to form an electron transport layer 6, which will be described below, and, furthermore, can be used as a layer obtained by combining the hole blocking layer and the electron transport layer 6.

The hole blocking layer may also have a single or multi-layer stack structure in which each layer is formed using one or more of the hole blocking compounds listed above.

In the organic EL element including the organic layer formed using the high molecular weight compound according to the present invention, the electron transport layer 6 is formed using an electron transport compound that is known per se. Examples of the known electron transport compound include metal complexes of quinolinol derivatives such as Alq₃ and BAlq, various types of metal complexes, a pyridine derivative, a pyrimidine derivative, a triazole derivative, a triazine derivative, an oxadiazole derivative, a thiadiazole derivative, a carbodiimide derivative, a quinoxaline derivative, a phenanthroline derivative, a silole derivative, a benzimidazole derivative, and the like.

The electron transport layer 6 may also have a single or multi-layer stack structure in which each layer is formed using one or more of the electron transport compounds listed above.

Furthermore, in the organic EL element including the organic layer formed using the high molecular weight compound according to the present invention, the electron injection layer formed optionally (not shown in the diagram) can also be formed using a material that is known per se. Examples of the known material include: alkali metal salts such as lithium fluoride and cesium fluoride; alkaline earth metal salts such as magnesium fluoride; metal oxides such as aluminum oxide; organic metal complexes such as lithium quinoline; and the like.

The cathode 7 of the organic EL element including the organic layer formed using the high molecular weight compound according to the present invention is formed using an electrode material that has a low work function such as aluminum, or an alloy that has an even lower work function such as a magnesium-silver alloy, a magnesium-indium alloy, or an aluminum-magnesium alloy is used as the electrode material.

As described above, at least one of the hole injection layer, the hole transport layer, the light emitting layer, and the electron blocking layer is formed using the high molecular weight compound according to the present invention. As a result, an organic EL element that has high light emission efficiency, high power efficiency, a low actual driving voltage, a low light-emission start voltage, and outstanding durability can be obtained. In particular, the organic EL element has a low driving voltage, improved current tolerance, and improved maximum light emission luminance while having high light emission efficiency.

EXAMPLES

Hereinafter, the present invention will be described by way of examples given below.

In the description given below, the structural unit represented by the general formula (1) included in the high molecular weight compound according to the present invention will be referred to as "structural unit A", the bonding structural unit represented by the general formula (2) will be referred to as "structural unit B", the thermal crosslinkable structural unit will be referred to as "structural unit C", and the triarylamine structural unit that is different from that represented by the general formula (1) will be referred to as "structural unit D".

Also, purification of a synthesized compound was performed through column chromatography or crystallization using a solvent, and identification of the compound was performed through NMR analysis.

In order to produce high molecular weight compounds according to the present invention, the following intermediates 1 to 9 were synthesized.

Synthesis of Intermediate 1

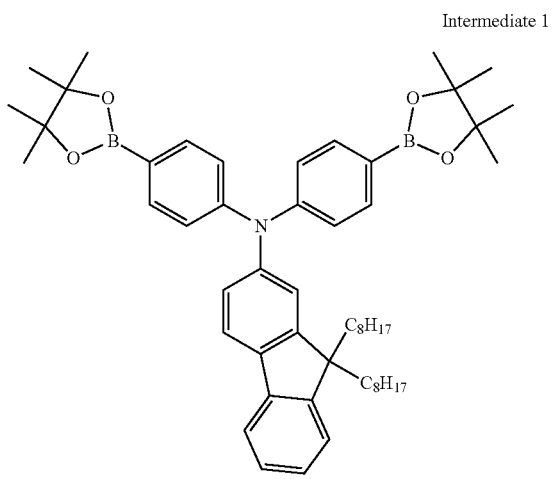

Intermediate 1

The following components were placed in a reaction vessel whose internal air was replaced with nitrogen, and nitrogen gas was passed through the reaction vessel for 30 minutes:

16.7 g of N,N-bis(4-bromophenyl)-9,9-di-n-octyl-9H-fluorene-2-amine:

11.9 g of bis(pinacolato)diboron;

5.7 g of potassium acetate; and 170 ml of 1,4-dioxane.

Then, 0.19 g of [1,1'-bis(diphenylphosphino)ferrocene]palladium(II)dichloride dichloromethane adduct was added, and the mixture was heated and stirred at 100° C. for 7 hours. After the mixture was cooled down to room temperature, water and toluene were added, and a separation operation was performed to extract an organic layer. The organic layer was dehydrated using magnesium sulfate anhydrous, and then concentrated under reduced pressure to obtain a crude product. The crude product was purified through column chromatography (ethyl acetate/n-hexane=1/20), and 7.6 g (yield 40%) of a white powder of intermediate 1 was thereby obtained.

Synthesis of Intermediate 2

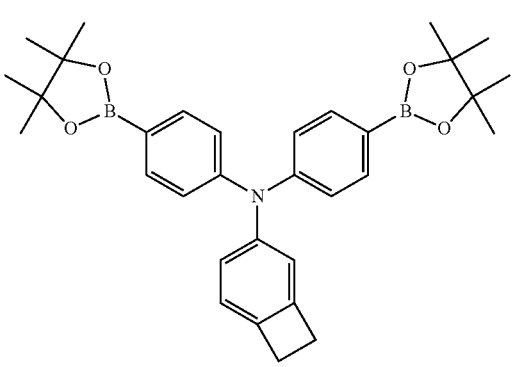

Intermediate 2

The following components were placed in a reaction vessel whose internal air was replaced with nitrogen, and nitrogen gas was passed through the reaction vessel for 30 minutes:
- 8.0 g of N,N-bis(4-bromophenyl)-N-(benzocyclobutene-4-yl)-amine;
- 9.9 g of bis(pinacolato)diboron;
- 4.6 g of potassium acetate; and
- 80 ml of 1,4-dioxane.

Then, 0.3 g of [1,1'-bis(diphenylphosphino)ferrocene]palladium(II) dichloride dichloromethane adduct was added, and the mixture was heated and stirred at 90° C. for 11 hours. After the mixture was cooled down to room temperature, water from a municipal source and toluene were added, and a separation operation was performed to extract an organic layer. The organic layer was dehydrated using magnesium sulfate anhydrous, and then concentrated under reduced pressure to obtain a crude product. The crude product was recrystallized with toluene/methanol=1/2, and 3.4 g (yield 35%) of a white powder of intermediate 2 was thereby obtained.

Synthesis of Intermediate 3

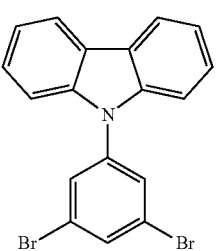

Intermediate 3

The following components were placed in a reaction vessel whose internal air was replaced with nitrogen, and heated and stirred at 160° C. for 14 hours.
- 5.2 g of 1,3-dibromo-5-iodobenzene;
- 2.3 g of carbazole;
- 91 mg of copper;
- 2.6 g of potassium carbonate;
- 0.2 g of sodium bisulfite; and
- 10 ml of dodecylbenzene.

After the mixture was cooled down to 50° C., toluene was added, and the mixture was stirred for 1 hour and filtered. The filtrate was concentrated under reduced pressure to obtain a crude product. The crude product was purified through column chromatography (n-hexane), and 2.2 g (yield 39%) of a white powder of intermediate 3 was thereby obtained.

Synthesis of Intermediate 4

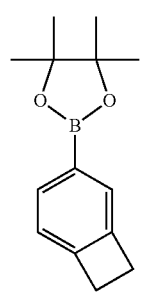

Intermediate 4

The following components were placed in a reaction vessel whose internal air was replaced with nitrogen, and nitrogen gas was passed through the reaction vessel for 30 minutes:
- 9.8 g of 4-bromobenzocyclobutene;
- 15.0 g of bis(pinacolato)diboron;
- 7.9 g of potassium acetate; and
- 100 ml of 1,4-dioxane.

Then, 0.4 g of [1,1'-bis(diphenylphosphino) ferrocene] palladium(II) dichloride dichloromethane adduct was added, and the mixture was heated and stirred at 90° C. for 8 hours. After the mixture was cooled down to room temperature, water and toluene were added, and a separation operation was performed to extract an organic layer. The organic layer was dehydrated using magnesium sulfate anhydrous and adsorbed and purified by adding 62 g of silica gel, and then concentrated under reduced pressure, and 11.4 g (yield 93%) of a pale yellow oil of intermediate 4 was thereby obtained.

Synthesis of Intermediate 5

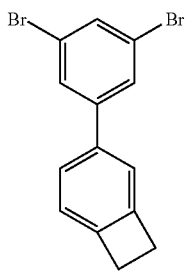

Intermediate 5

The following components were placed in a reaction vessel whose internal air was replaced with nitrogen, and nitrogen gas was passed through the reaction vessel for 30 minutes:
- 5.7 g of 1,3-dibromo-5-iodobenzene;
- 3.7 g of intermediate 4;

12 ml of aqueous solution of 2 M-potassium carbonate; and 79 ml of 1,4-dioxane.

Then, 0.1 g of tetrakis(triphenylphosphine)palladium(0) was added, and the mixture was heated and stirred under reflux for 17 hours. After the mixture was cooled down to room temperature, water and toluene were added, and a separation operation was performed to extract an organic layer. The organic layer was dehydrated using magnesium sulfate anhydrous, and then concentrated under reduced pressure to obtain a crude product. The crude product was purified through column chromatography (n-hexane), and 2.4 g (yield 26%) of a brown powder of intermediate 5 was thereby obtained.

Synthesis of Intermediate 6

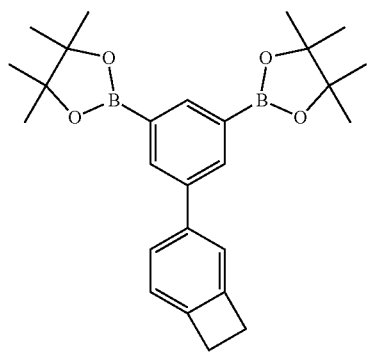

Intermediate 6

The following components were placed in a reaction vessel whose internal air was replaced with nitrogen, and nitrogen gas was passed through the reaction vessel for 30 minutes:

2.3 g of intermediate 5;

3.8 g of bis(pinacolato)diboron;

2.0 g of potassium acetate; and 23 ml of 1,4-dioxane.

Then, 60 mg of [1,1'-bis(diphenylphosphino)ferrocene] palladium (II)dichloride dichloromethane adduct was added, and the mixture was heated and stirred at 90° C. for 17 hours. After the mixture was cooled down to room temperature, water and toluene were added, and a separation operation was performed to extract an organic layer. The organic layer was dehydrated using magnesium sulfate anhydrous, and then concentrated under reduced pressure to obtain a crude product. The crude product was purified through column chromatography (ethyl acetate/n-hexane=1/19), and 1.3 g (yield 45%) of a white powder of intermediate 6 was thereby obtained.

Synthesis of Intermediate 7

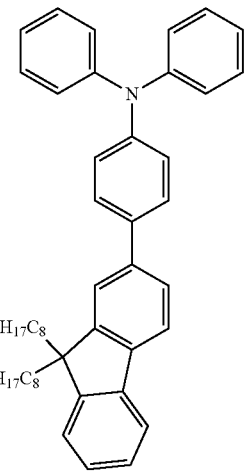

Intermediate 7

The following components were placed in a reaction vessel whose internal air was replaced with nitrogen, and nitrogen gas was passed through the reaction vessel for 30 minutes.

20.0 g of 2-bromo-9,9-dioctylfluorene;

16.6 g of N,N-diphenyl-4-(4,4,5,5-tetramethyl-1,3,2-dioxaborolane-2-yl)benzeneamine;

28 ml of aqueous solution of 2 M-potassium carbonate;

100 ml of toluene; and 25 ml of ethanol.

Then, 1.0 g of tetrakis(triphenylphosphine)palladium(0) was added, and the mixture was heated and stirred under reflux for 6 hours. After the mixture was cooled down to room temperature, water and toluene were added, and a separation operation was performed to extract an organic layer. The organic layer was dehydrated using magnesium sulfate anhydrous, and then concentrated under reduced pressure to obtain a crude product. The crude product was purified through column chromatography (n-hexane), and 25.1 g (yield 93%) of a pale yellow oil of intermediate 7 was thereby obtained.

Synthesis of Intermediate 8

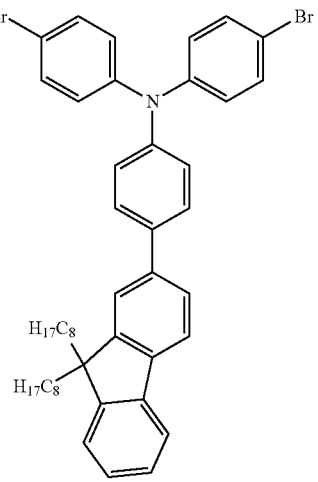

Intermediate 8

The following components were placed in a reaction vessel whose internal air was replaced with nitrogen.

24.9 g of intermediate 7; and 150 ml of tetrahydrofuran.

Then, at room temperature, 13.3 g of N-bromosuccinimide was added, and the mixture was stirred for 5 hours.

Then, water and toluene were added, and a separation operation was performed to extract an organic layer. The organic layer was dehydrated using magnesium sulfate anhydrous, and then concentrated under reduced pressure, and 29.5 g (yield 95%) of an orange oil of intermediate 8 was thereby obtained.

Synthesis of Intermediate 9

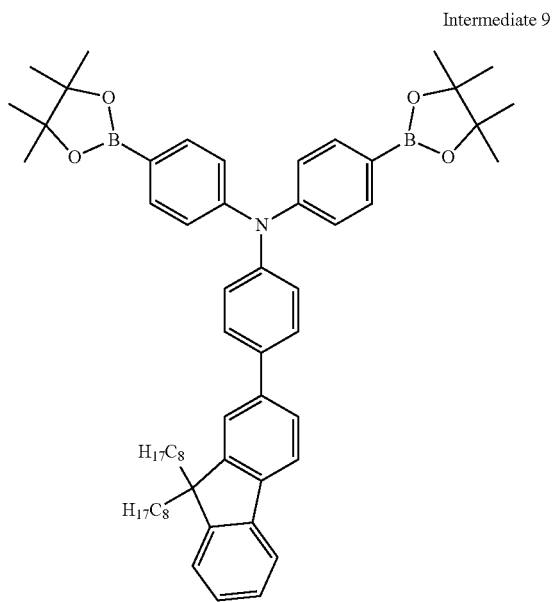

Intermediate 9

The following components were placed in a reaction vessel whose internal air was replaced with nitrogen, and nitrogen gas was passed through the reaction vessel for 30 minutes:

29.4 g of intermediate 8;

19.8 g of bis(pinacolato)diboron;

9.1 g of potassium acetate; and 200 ml of 1,4-dioxane.

Then, 0.3 g of [1,1'-bis(diphenylphosphino)ferrocene]palladium (II)dichloride dichloromethane adduct was added, and the mixture was heated and stirred at 100° C. for 10 hours. After the mixture was cooled down to room temperature, water and toluene were added, and a separation operation was performed to extract an organic layer. The organic layer was dehydrated using magnesium sulfate anhydrous, and then concentrated under reduced pressure to obtain a crude product. The crude product was purified through column chromatography (ethyl acetate/n-hexane=1/20), and 8.0 g (yield 24%) of a white powder of intermediate 9 was thereby obtained.

Example 1

Synthesis of High Molecular Weight Compound A

The following components were placed in a reaction vessel whose internal air was replaced with nitrogen, and nitrogen gas was passed through the reaction vessel for 30 minutes:

5.0 g of intermediate 1;

1.8 g of 1,3-dibromobenzene;

0.8 g of intermediate 2;

6.9 g of tripotassium phosphate;

9 ml of toluene;

5 ml of water; and 27 ml of 1,4-dioxane.

Then, 1.4 mg of palladium(II) acetate and 11.5 mg of tri-o-tolylphosphine were added, and the mixture was heated and stirred at 87° C. for 14 hours. Then, 17 mg of phenylboronic acid was added and the mixture was stirred for 1 hour, and then 242 mg of bromobenzene was added and the mixture was stirred for 1 hour. Then, 50 ml of toluene and 50 ml of 5 wt % aqueous solution of N,N-sodium diethyldithiocarbamate were added, and the mixture was heated and stirred under reflux for 2 hours. After the mixture was cooled down to room temperature, a separation operation was performed to extract an organic layer. The organic layer was washed three times with a saturated saline solution. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 100 ml of toluene was added to a dried solid to dissolve the dried solid, the resultant was dripped into 300 ml of n-hexane, and a precipitate was obtained through filtering. This operation was repeated three times, and the resultant was dried to obtain 3.5 g (yield 78%) of high molecular weight compound A.

The average molecular weight measured using GPC and the degree of dispersion of the high molecular weight compound A were as follows.

Number average molecular weight Mn (on polystyrene basis): 32,000

Weight average molecular weight Mw (on polystyrene basis): 55,000

Degree of dispersion (Mw/Mn): 1.7

Figure 8:
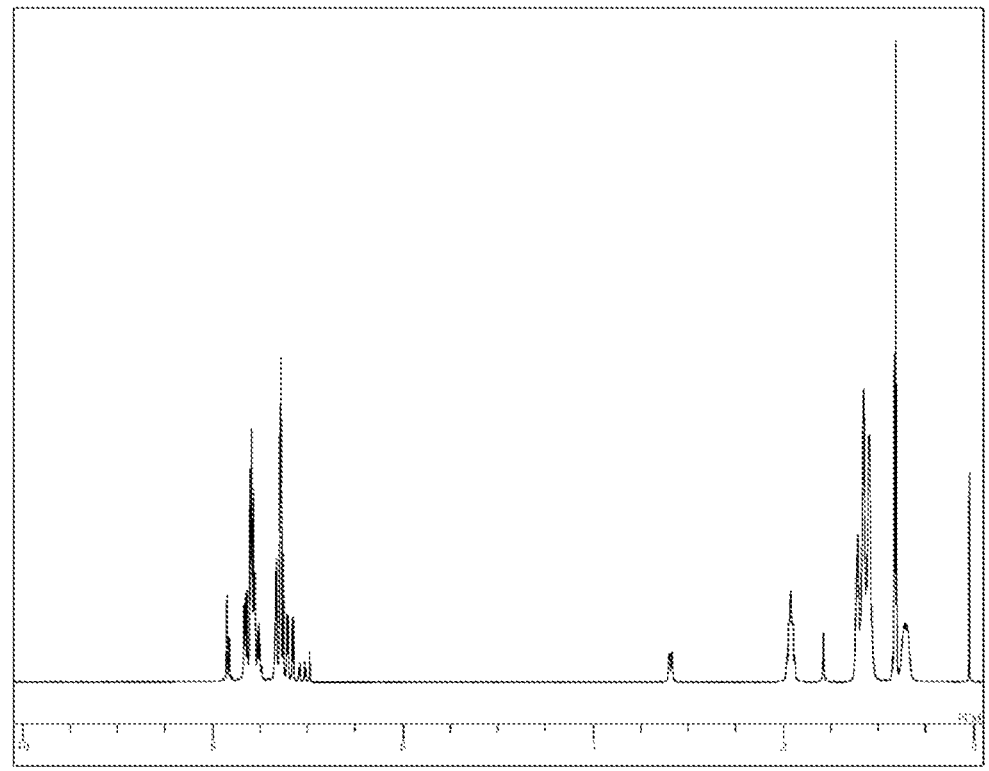
FIG. 8 A diagram showing a $^1$H-NMR chart of a high molecular weight compound (compound A) according to the present invention synthesized in Example 1.

Furthermore, the high molecular weight compound A was subjected to NMR measurement. FIG. 8 shows the result of $^1$H-NMR measurement. The chemical composition formula thereof was as follows.

High Molecular Weight Compound A

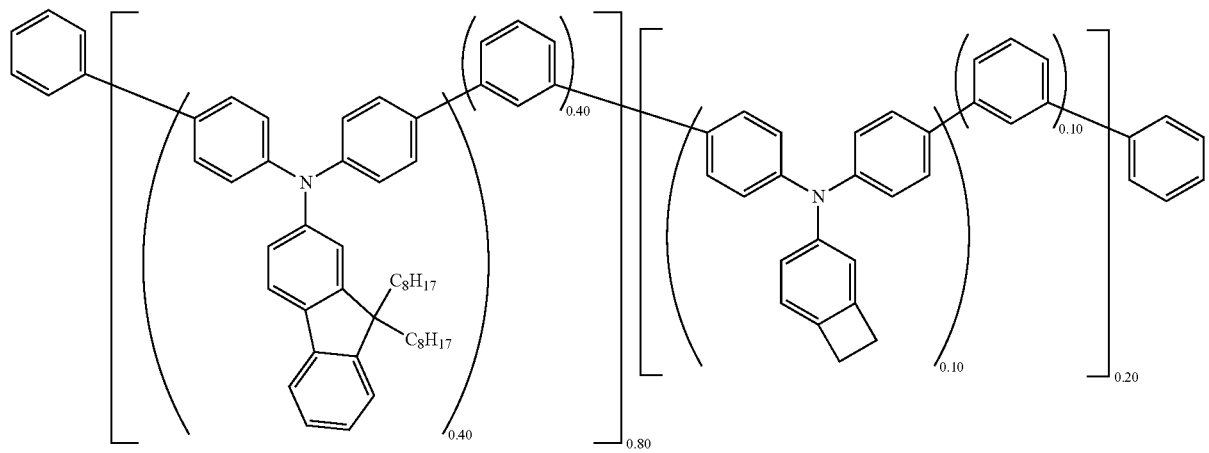

As can be understood from the chemical composition given above, the high molecular weight compound A contained 40 mol % of the structural unit A represented by the general formula (1), 50 mol % of the structural unit B represented by the general formula (2), and 10 mol % of thermal crosslinkable structural unit C.

Example 2

Synthesis of High Molecular Weight Compound B

The following components were placed in a reaction vessel whose internal air was replaced with nitrogen, and nitrogen gas was passed through the reaction vessel for 30 minutes:
  4.0 g of intermediate 1;
  3.6 g of 1,4-dibromobenzene;
  0.9 g of intermediate 2;
  5.2 g of tripotassium phosphate;
  7 ml of toluene;
  4 ml of water; and
  22 ml of 1,4-dioxane.
Then, 1.1 mg of palladium(II) acetate and 8.7 mg of tri-o-tolylphosphine were added, and the mixture was heated and stirred at 83° C. for 7.5 hours. Then, 17 mg of phenylboronic acid was added and the mixture was stirred for 1 hour, and then 196 mg of bromobenzene was added and the mixture was stirred for 1 hour. Then, 100 ml of toluene and 100 ml of 5 wt % aqueous solution of N,N-sodium diethyldithiocarbamate were added, and the mixture was heated and stirred under reflux for 2 hours. After the mixture was cooled down to room temperature, a separation operation was performed to extract an organic layer. The organic layer was washed three times with a saturated saline solution. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 120 ml of toluene was added to a dried solid to dissolve the dried solid, the resultant was dripped into 240 ml of n-hexane, and a precipitate was obtained through filtering. This operation was repeated twice, and the resultant was dried to obtain 3.1 g (yield 86%) of high molecular weight compound B.

The average molecular weight measured using GPC and the degree of dispersion of the high molecular weight compound B were as follows.

Number average molecular weight Mn (on polystyrene basis): 32,000
  Weight average molecular weight Mw (on polystyrene basis): 57,000
  Degree of dispersion (Mw/Mn): 1.8

Figure 9:
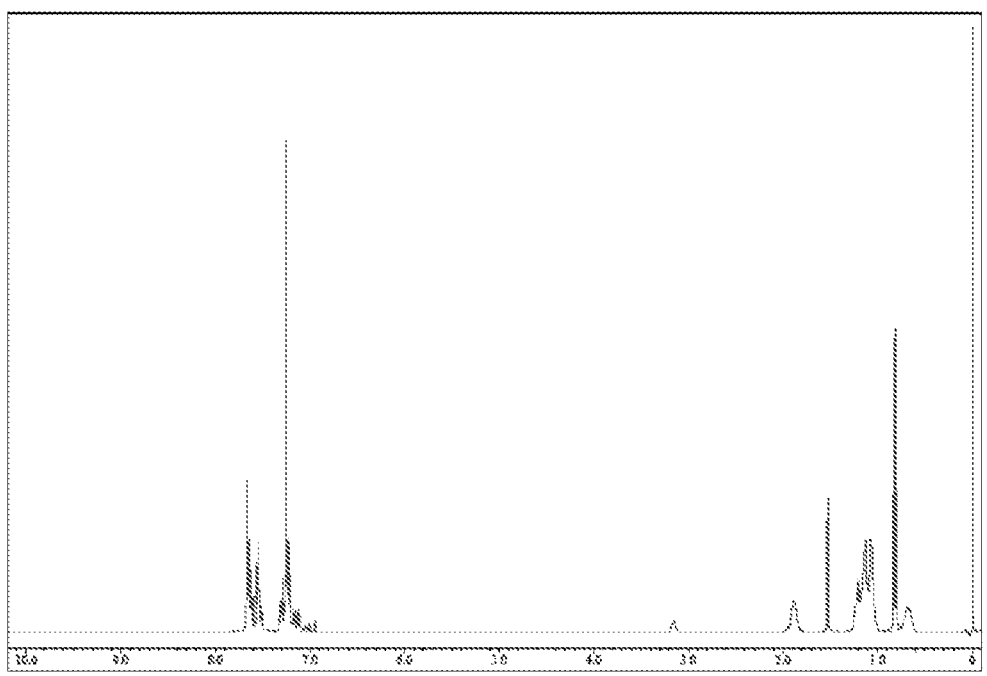
FIG. 9 A diagram showing a $^1$H-NMR chart of a high molecular weight compound (compound B) according to the present invention synthesized in Example 2.

Furthermore, the high molecular weight compound B was subjected to NMR measurement. FIG. 9 shows the result of $^1$H-NMR measurement. The chemical composition formula thereof was as follows.

High Molecular Weight Compound B

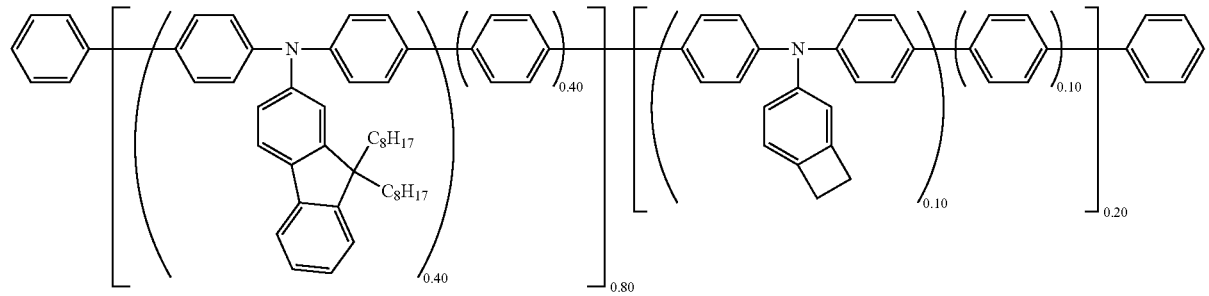

As can be understood from the chemical composition given above, the high molecular weight compound B contained 40 mol % of the structural unit A represented by the general formula (1), 50 mol % of the structural unit B represented by the general formula (2), and 10 mol % of thermal crosslinkable structural unit C.

Example 3

Synthesis of High Molecular Weight Compound C

The following components were placed in a reaction vessel whose internal air was replaced with nitrogen, and nitrogen gas was passed through the reaction vessel for 30 minutes:
- 3.4 g of intermediate 1;
- 2.1 g of intermediate 3;
- 0.5 g of intermediate 2;
- 4.7 g of tripotassium phosphate;
- 7 ml of toluene;
- 4 ml of water; and
- 21 ml of 1,4-dioxane.

Then, 5 mg of tetrakis(triphenylphosphine)palladium(0) was added, and the mixture was heated and stirred at 90° C. for 19.5 hours. Then, 12 mg of phenylboronic acid was added and the mixture was stirred for 1 hour, and then 165 mg of bromobenzene was added and the mixture was stirred for 1 hour. Then, 50 ml of toluene and 50 ml of 5 wt % aqueous solution of N,N-sodium diethyldithiocarbamate were added, and the mixture was heated and stirred under reflux for 2 hours. After the mixture was cooled down to room temperature, a separation operation was performed to extract an organic layer. The organic layer was washed three times with a saturated saline solution. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 80 ml of toluene was added to a dried solid to dissolve the dried solid, the resultant was dripped into 240 ml of n-hexane, and a precipitate was obtained through filtering. This operation was repeated three times, and the resultant was dried to obtain 3.0 g (yield 80%) of high molecular weight compound C.

The average molecular weight measured using GPC and the degree of dispersion of the high molecular weight compound C were as follows.
- Number average molecular weight Mn (on polystyrene basis): 35,000
- Weight average molecular weight Mw (on polystyrene basis): 69,000
- Degree of dispersion (Mw/Mn): 2.0

Figure 10:
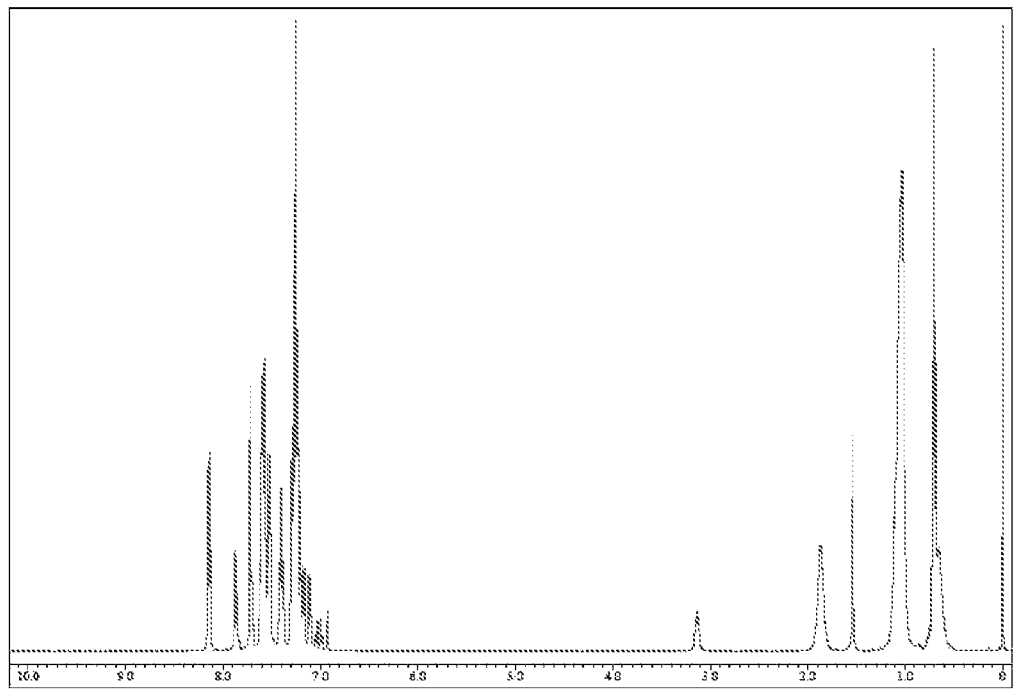
FIG. 10 A diagram showing a $^1$H-NMR chart of a high molecular weight compound (compound C) according to the present invention synthesized in Example 3.

Furthermore, the high molecular weight compound C was subjected to NMR measurement. FIG. 10 shows the result of $^1$H-NMR measurement. The chemical composition formula thereof was as follows.

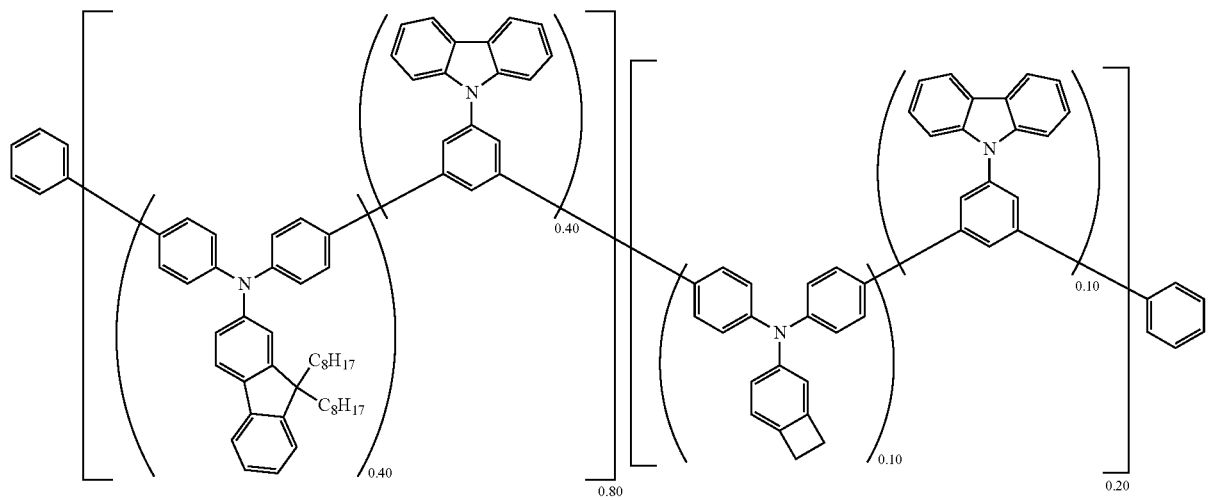

High Molecular Weight Compound C

As can be understood from the chemical composition given above, the high molecular weight compound C contained 40 mol % of the structural unit A represented by the general formula (1), 50 mol % of the structural unit B represented by the general formula (2), and 10 mol % of thermal crosslinkable structural unit C.

Example 4

Synthesis of High Molecular Weight Compound D

The following components were placed in a reaction vessel whose internal air was replaced with nitrogen, and nitrogen gas was passed through the reaction vessel for 30 minutes:
5.0 g of intermediate 1;
1.8 g of 1,3-dibromobenzene;
0.7 g of intermediate 6;
6.9 g of tripotassium phosphate;
9 ml of toluene;
5 ml of water; and
27 ml of 1,4-dioxane.

Then, 1.4 mg of palladium(II) acetate and 11.5 mg of tri-o-tolylphosphine were added, and the mixture was heated and stirred at 80° C. for 14 hours. Then, 17 mg of phenylboronic acid was added and the mixture was stirred for 1 hour, and then 242 mg of bromobenzene was added and the mixture was stirred for 1 hour. Then, 100 ml of toluene and 50 ml of 5 wt % aqueous solution of N,N-sodium diethyldithiocarbamate were added, and the mixture was heated and stirred under reflux for 2 hours. After the mixture was cooled down to room temperature, a separation operation was performed to extract an organic layer. The organic layer was washed three times with a saturated saline solution. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 100 ml of toluene was added to a dried solid to dissolve the dried solid, the resultant was dripped into 300 ml of n-hexane, and a precipitate was obtained through filtering. This operation was repeated three times, and the resultant was dried to obtain 3.2 g (yield 73%) of high molecular weight compound D.

The average molecular weight measured using GPC and the degree of dispersion of the high molecular weight compound D were as follows.

Number average molecular weight Mn (on polystyrene basis): 44,000
Weight average molecular weight Mw (on polystyrene basis): 71,000
Degree of dispersion (Mw/Mn): 1.6

Figure 11:
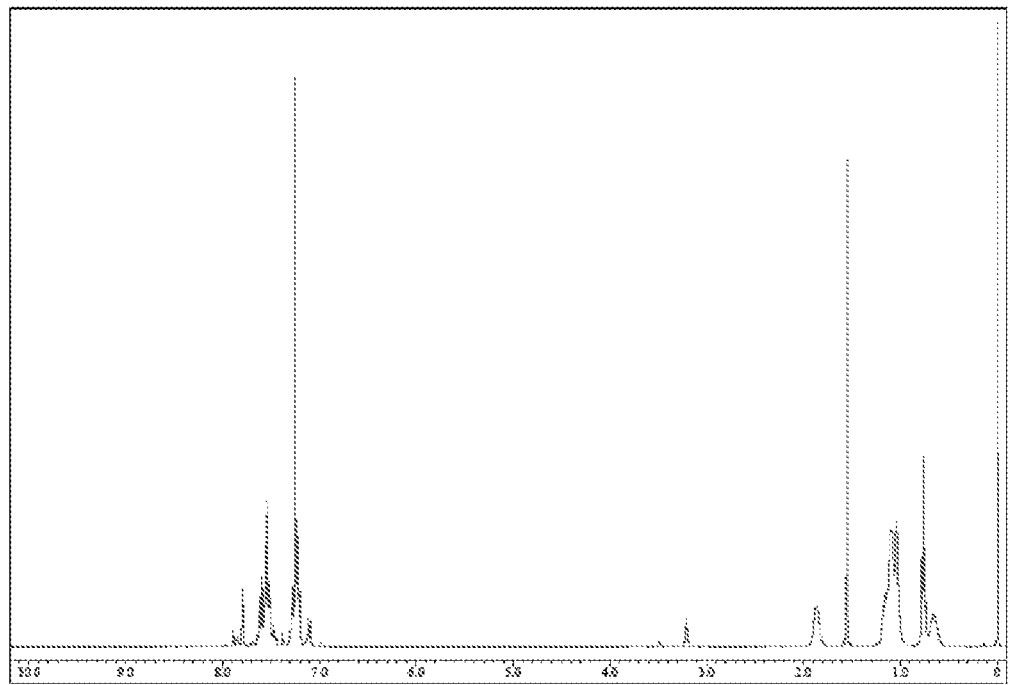
FIG. 11 A diagram showing a $^1$H-NMR chart of a high molecular weight compound (compound D) according to the present invention synthesized in Example 4.

Furthermore, the high molecular weight compound D was subjected to NMR measurement. FIG. 11 shows the result of $^1$H-NMR measurement. The chemical composition formula thereof was as follows.

High Molecular Weight Compound D

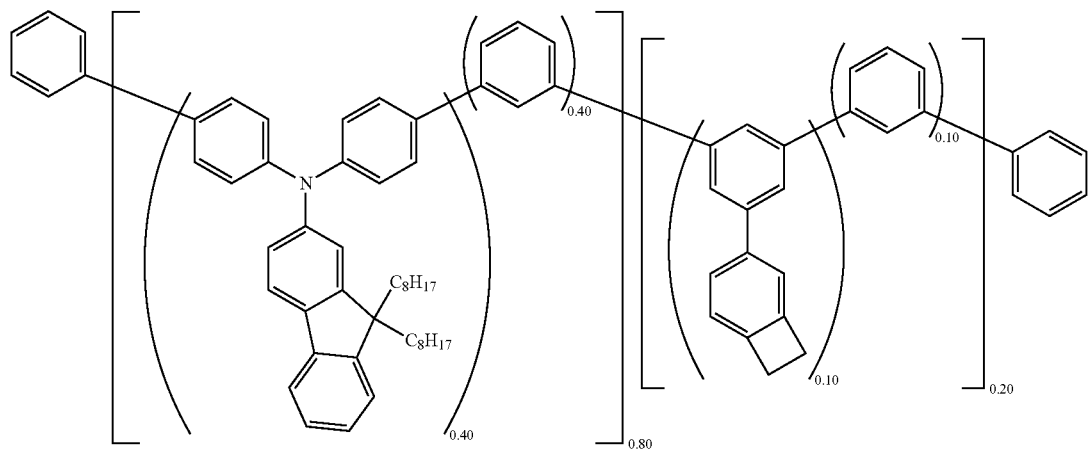

As can be understood from the chemical composition given above, the high molecular weight compound D contained 40 mol % of the structural unit A represented by the general formula (1), 50 mol % of the structural unit B represented by the general formula (2), and 10 mol % of thermal crosslinkable structural unit C.

Example 5

Synthesis of High Molecular Weight Compound E

The following components were placed in a reaction vessel whose internal air was replaced with nitrogen, and nitrogen gas was passed through the reaction vessel for 30 minutes.
5.0 g of intermediate 9;
1.7 g of 1,3-dibromobenzene;
0.7 g of intermediate 2;
6.3 g of tripotassium phosphate;
9 ml of toluene:
5 ml of water; and
27 ml of 1,4-dioxane.
Then, 1.3 mg of palladium(II) acetate and 10.5 mg of tri-o-tolylphosphine were added, and the mixture was heated and stirred at 88° C. for 11 hours. Then, 16 mg of phenylboronic acid was added and the mixture was stirred for 1 hour, and then 222 mg of bromobenzene was added and the mixture was stirred for 1 hour. Then, 50 ml of toluene and 50 ml of 5 wt % aqueous solution of N,N-sodium diethyldithiocarbamate were added, and the mixture was heated and stirred under reflux for 2 hours. After the mixture was cooled down to room temperature, a separation operation was performed to extract an organic layer. The organic layer was washed three times with a saturated saline solution. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 100 ml of toluene was added to a dried solid to dissolve the dried solid, the resultant was dripped into 100 ml of n-hexane, and a precipitate was obtained through filtering. This operation was repeated three times, and the resultant was dried to obtain 2.2 g (yield 48%) of high molecular weight compound E.

Figure 12:
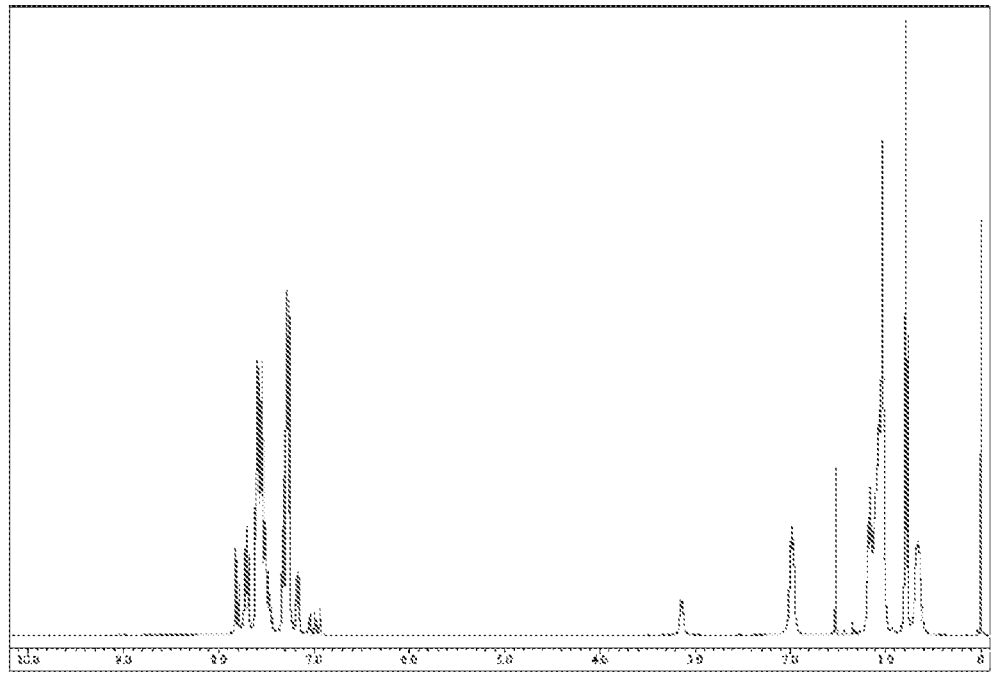
FIG. 12 A diagram showing a $^1$H-NMR chart of a high molecular weight compound (compound E) according to the present invention synthesized in Example 5.

The average molecular weight measured using GPC and the degree of dispersion of the high molecular weight compound E were as follows.
Number average molecular weight Mn (on polystyrene basis): 55,000
Weight average molecular weight Mw (on polystyrene basis): 93,000
Degree of dispersion (Mw/Mn): 1.7
Furthermore, the high molecular weight compound E was subjected to NMR measurement. FIG. 12 shows the result of $^1$H-NMR measurement. The chemical composition formula thereof was as follows.

High Molecular Weight Compound E

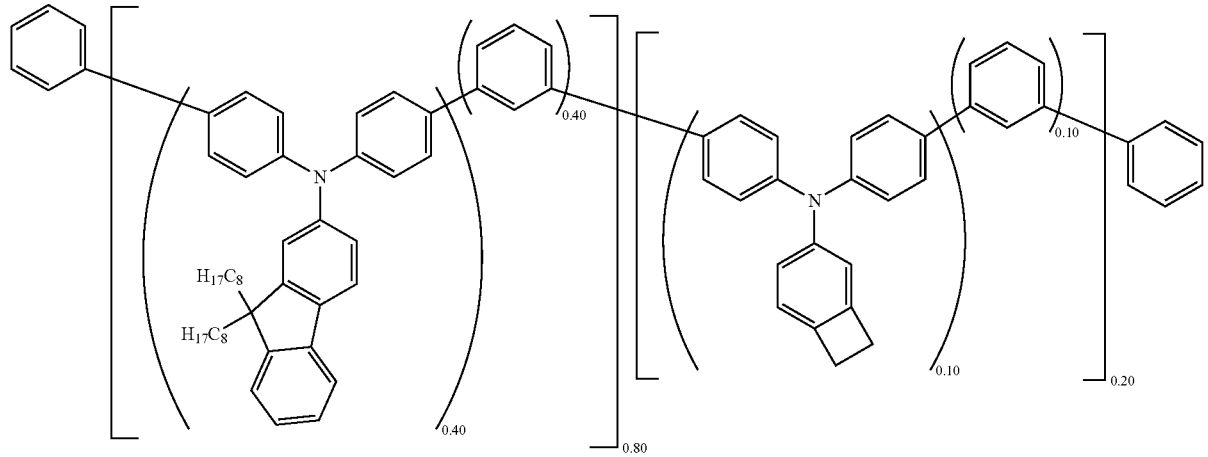

As can be understood from the chemical composition given above, the high molecular weight compound E contained 40 mol % of the structural unit A represented by the general formula (1), 50 mol % of the structural unit B represented by the general formula (2), and 10 mol % of thermal crosslinkable structural unit C.

Example 6

Synthesis of High Molecular Weight Compound F

The following components were placed in a reaction vessel whose internal air was replaced with nitrogen, and nitrogen gas was passed through the reaction vessel for 30 minutes:
5.0 g of intermediate 1;
1.8 g of 1,3-dibromobenzene;
0.8 g of
N-phenyl-4-(4,4,5,5-tetramethyl-1,3,2-dioxaborolane-2-yl)-N-[4-(4,4,5,5-tetramethyl-1,3,2-dioxaborolane-2-yl)phenyl]benzeneamine;
6.9 g of tripotassium phosphate;
9 ml of toluene;
5 ml of water; and
27 ml of 1,4-dioxane.
Then, 1.4 mg of palladium(II) acetate and 11.5 mg of tri-o-tolylphosphine were added, and the mixture was heated and stirred at 86° C. for 11.5 hours. Then, 17 mg of phenylboronic acid was added and the mixture was stirred for 1 hour, and then 242 mg of bromobenzene was added and the mixture was stirred for 1 hour. Then, 50 ml of toluene and 50 ml of 5 wt % aqueous solution of N,N-sodium diethyldithiocarbamate were added, and the mixture was heated and stirred under reflux for 2 hours. After the mixture was cooled down to room temperature, a separation operation was performed to extract an organic layer. The organic layer was washed three times with a saturated saline solution. The organic layer was dehydrated using magnesium sulfate anhydrous, and then concentrated under reduced pressure to obtain a crude polymer. The crude polymer was dissolved in toluene and adsorbed and purified by adding a silica gel, and then the silica gel was removed through filtering. The obtained filtrate was concentrated under reduced pressure, 100 ml of toluene was added to a dried solid to dissolve the dried solid, the resultant was dripped into 300 ml of n-hexane, and a precipitate was obtained through filtering. This operation was repeated three times, and the resultant was dried to obtain 3.4 g (yield 75%) of high molecular weight compound F.

The average molecular weight measured using GPC and the degree of dispersion of the high molecular weight compound F were as follows.

Number average molecular weight Mn (on polystyrene basis): 32,000

Weight average molecular weight Mw (on polystyrene basis): 54,000

Degree of dispersion (Mw/Mn): 1.7

Figure 13:
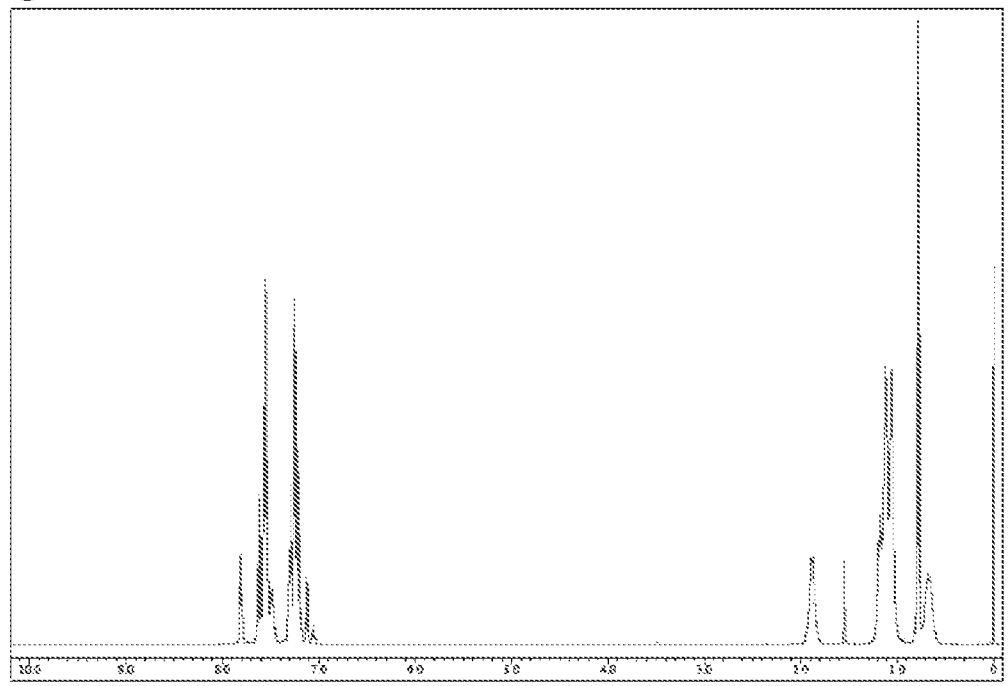
FIG. 13 A diagram showing a $^1$H-NMR chart of a high molecular weight compound (compound F) according to the present invention synthesized in Example 6.

Furthermore, the high molecular weight compound F was subjected to NMR measurement. FIG. 13 shows the result of $^1$H-NMR measurement. The chemical composition formula thereof was as follows.

work function was measured using an ionization potential measurement apparatus (Model PYS-202 available from Sumitomo Heavy Industries, Ltd.). The result was as follows.

TABLE 1

|  |  | Work function (eV) |
|---|---|---|
| Example 1 | High molecular weight compound A | 5.66 |
| Example 2 | High molecular weight compound B | 5.48 |
| Example 3 | High molecular weight compound C | 5.73 |
| Example 4 | High molecular weight compound D | 5.64 |
| Example 5 | High molecular weight compound E | 5.68 |
| Example 6 | High molecular weight compound F | 5.64 |

The high molecular weight compounds A to F according to the present invention exhibited a preferable energy level higher than 5.4 eV that is the work function of ordinary hole transport materials such as NPD and TPD, from which it can be seen that the high molecular weight compounds A to F have good hole transport capability.

Example 8

(Production and Evaluation of Organic EL Element)

Figure 6:
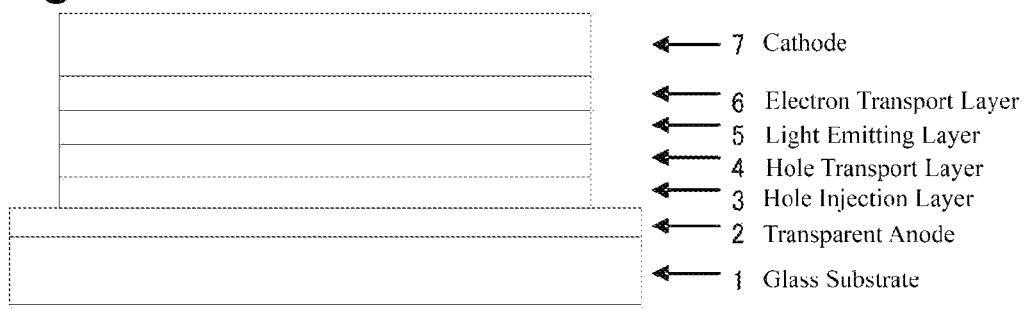
FIG. 6 A diagram showing an example of a layer configuration of an organic EL element according to the present invention.

An organic EL element having a layer structure shown in FIG. 6 was produced in the following manner.

Specifically, a glass substrate 1 on which an ITO film having a thickness of 50 nm was formed was washed with an organic solvent, and then UV/ozone treatment was performed to wash the surface of the ITO film. A PEDOT/PSS High Molecular Weight Compound F

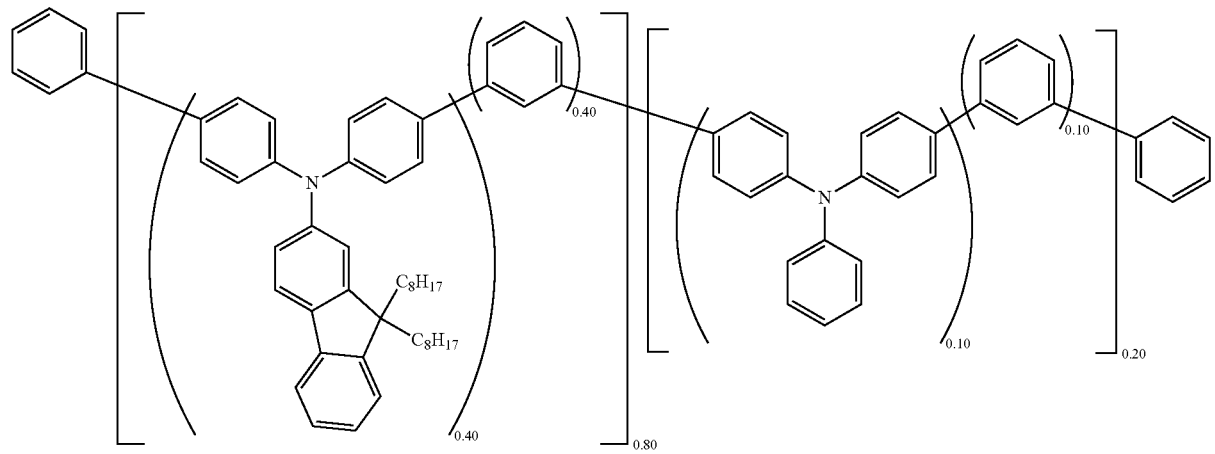

As can be understood from the chemical composition given above, the high molecular weight compound F contained 40 mol % of the structural unit A represented by the general formula (1), 50 mol % of the structural unit B represented by the general formula (2), and 10 mol % of the triarylamine structural unit D that is different from that represented by the general formula (1).

Example 7

(Measurement of Work Function)

Coating films each having a thickness of 80 nm were formed on an ITO substrate using the high molecular weight compounds A to F synthesized in Examples 1 to 6, and the (available from HERAEUS) was applied using a spin coating method so as to cover the transparent anode 2 (ITO) formed on the glass substrate 1, and a 50 nm thick film was thereby formed. The film was dried on a hot plate at 200° C. for 10 minutes, and a hole injection layer 3 was thereby formed.

A coating solution was prepared by dissolving the high molecular weight compound A obtained in Example 1 in toluene at a concentration of 0.6 wt %. The substrate on which the hole injection layer 3 was formed in the manner described above was placed in a glove box whose internal air was replaced with dry nitrogen, and a coating layer having a thickness of 25 nm was formed on the hole injection layer 3 through spin coating using the coating solution described above, and dried on a hot plate at 200° C. for 10 minutes, and a hole transport layer 4 was thereby formed.

The substrate on which the hole transport layer 4 was formed in the manner described above was set in a vacuum deposition apparatus, and the pressure was reduced to 0.001 Pa or less. A light emitting layer 5 having a thickness of 34 nm was formed on the hole transport layer 4 through dual deposition using a blue light emitting material (EMD-1) and a host material (EMH-1) represented by the structure formulae below. In the dual deposition, the ratio of deposition rate was set to EMD-1:EMH-1=4:96.

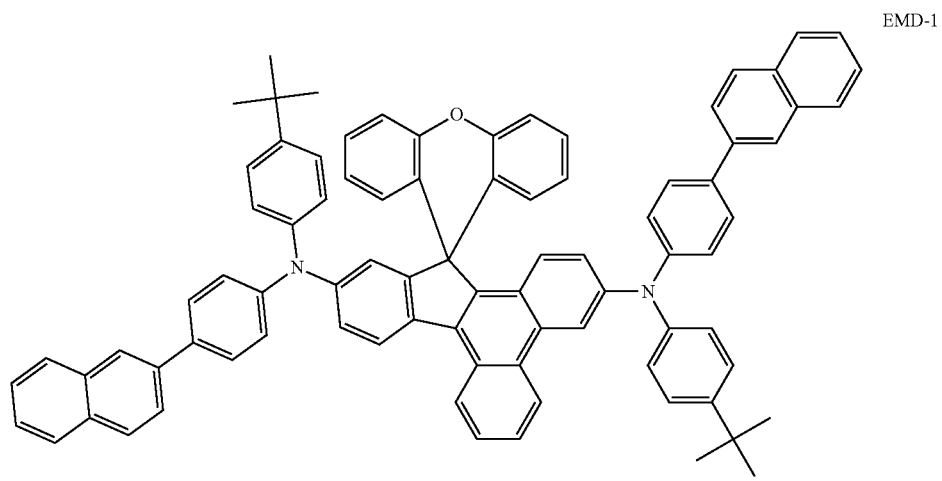

EMD-1

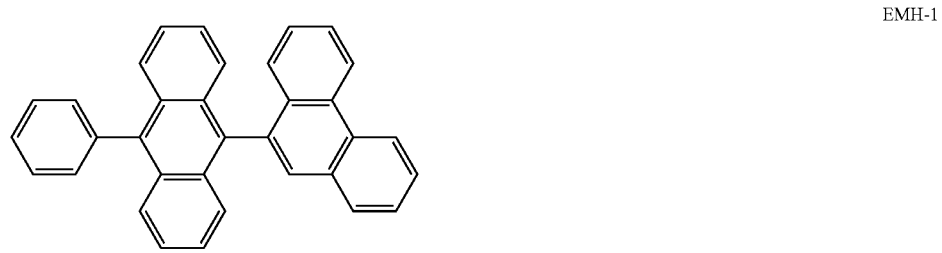

EMH-1

Compounds ETM-1 and ETM-2 represented by the following structural formulae were prepared as the electron transport materials.

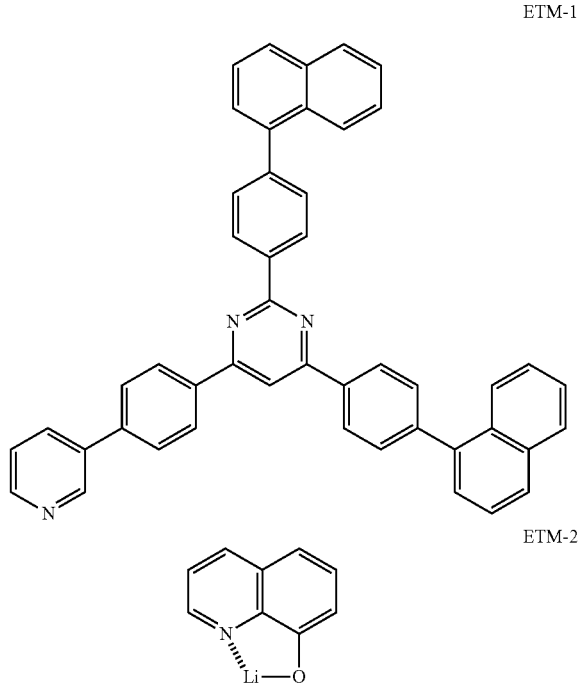

An electron transport layer 6 having a thickness of 20 nm was formed on the light emitting layer 5 formed above through dual deposition using the electron transport materials ETM-1 and ETM-2.

In the dual deposition, the ratio of deposition rate was set to ETM-1:ETM-2=50:50.

Finally, aluminum was deposited so as to form a film having a thickness of 100 nm, and a cathode 7 was thereby formed.

The glass substrate on which the transparent anode 2, the hole injection layer 3, the hole transport layer 4, the light emitting layer 5, the electron transport layer 6, and the cathode 7 were formed, was placed in a glove box whose internal air was replaced with dry nitrogen, and another glass substrate for sealing was bonded using a UV curable resin, and an organic EL element was thereby produced. The characteristics of the produced organic EL element were measured in an atmosphere at room temperature.

Also, light emission characteristics when applying a DC voltage to the produced organic EL element were measured. The measurement results are shown in Table 2.

Example 9

An organic EL element was produced as in Example 8, except that the hole transport layer 4 was formed using a coating solution prepared by dissolving, instead of the high molecular weight compound A, the compound (the high molecular weight compound B) of Example 2 in toluene at a concentration of 0.6 wt %. The characteristics of the produced organic EL element were measured in an atmosphere at room temperature. The measurement results of light emission characteristics as measured while applying a DC voltage to the produced organic EL element are shown in Table 2.

Example 10

An organic EL element was produced as in Example 8, except that the hole transport layer 4 was formed using a coating solution prepared by dissolving, instead of the high molecular weight compound A, the compound (the high molecular weight compound C) of Example 3 in toluene at a concentration of 0.6 wt %. The characteristics of the produced organic EL element were measured in an atmosphere at room temperature. The measurement results of light emission characteristics as measured while applying a DC voltage to the produced organic EL element are shown in Table 2.

Example 11

An organic EL element was produced as in Example 8, except that the hole transport layer 4 was formed using a coating solution prepared by dissolving, instead of the high molecular weight compound A, the compound (the high molecular weight compound D) of Example 4 in toluene at a concentration of 0.6 wt %. The characteristics of the produced organic EL element were measured in an atmosphere at room temperature. The measurement results of light emission characteristics as measured while applying a DC voltage to the produced organic EL element are shown in Table 2.

Example 12

An organic EL element was produced as in Example 8, except that the hole transport layer 4 was formed using a coating solution prepared by dissolving, instead of the high molecular weight compound A, the compound (the high molecular weight compound E) of Example 5 in toluene at a concentration of 0.6 wt %. The characteristics of the produced organic EL element were measured in an atmosphere at room temperature. The measurement results of light emission characteristics as measured while applying a DC voltage to the produced organic EL element are shown in Table 2.

Example 13

An organic EL element was produced as in Example 8, except that the hole transport layer 4 was formed using a coating solution prepared by dissolving, instead of the high molecular weight compound A, the compound (the high molecular weight compound F) of Example 6 in toluene at a concentration of 0.6 wt %. The characteristics of the produced organic EL element were measured in an atmosphere at room temperature. The measurement results of light emission characteristics as measured while applying a DC voltage to the produced organic EL element are shown in Table 2.

Comparative Example 1

An organic EL element was produced as in Example 8, except that the hole transport layer 4 was formed using a coating solution prepared by dissolving, instead of the high molecular weight compound A, TFB (hole transport polymer) shown below in toluene at a concentration of 0.6 wt %.

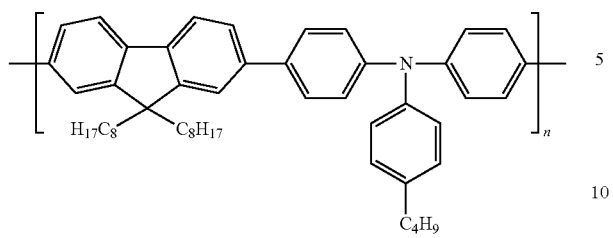

TFB

TFB (hole transport polymer) is poly[(9,9-dioctylfluorenyl-2,7-diyl)-co-(4,4'-(N-(4-sec-butylphenyl))diphenylamine)](Hole Transport Polymer ADS259BE available from American Dye Source). Various characteristics of the organic EL element of Comparative Example 1 were evaluated as in Example 8. The results are shown in Table 2.

In the evaluation of various characteristics, element lifespan is defined as the time taken for light emission luminance to decay from 700 cd/m$^2$, the light emission luminance being set to when light emission starts (initial luminance), to 560 cd/m$^2$ (corresponding to 80% of the initial luminance being set to 100%: at a decay of 80%) when constant current driving is performed.

TABLE 2

| | High molecular weight compound | Voltage [V] (@ 10 mA/cm$^2$) | Luminance [cd/m$^2$] (@ 10 mA/cm$^2$) | Light emission efficiency [cd/A] (@ 10 mA/cm$^2$) | Power efficiency [lm/W] (@ 10 mA/cm$^2$) | Element lifespan at decay of 80% (@ 700 cd/m$^2$) |
|---|---|---|---|---|---|---|
| Example 8 | A | 4.25 | 904 | 9.03 | 6.69 | 190 hours |
| Example 9 | B | 4.00 | 737 | 7.37 | 5.79 | 115 hours |
| Example 10 | C | 4.48 | 956 | 9.58 | 6.72 | 83 hours |
| Example 11 | D | 4.07 | 702 | 7.01 | 5.41 | 409 hours |
| Example 12 | E | 4.18 | 780 | 7.80 | 5.87 | 264 hours |
| Example 13 | F | 4.09 | 883 | 8.82 | 6.46 | 29 hours |
| Comparative Example 1 | TFB | 3.89 | 552 | 5.53 | 4.47 | 7 hours |

As shown in Table 2, the light emission efficiency at an electric current density of 10 mA/cm$^2$ was 9.03 cd/A in the organic EL element of Example 8, 7.37 cd/A in the organic EL element of Example 9, 9.58 cd/A in the organic EL element of Example 10, 7.01 cd/A in the organic EL element of Example 11, 7.80 cd/A in the organic EL element of Example 12, and 8.82 cd/A in the organic EL element of Example 13, relative to 5.53 cd/A in the organic EL element of Comparative Example 1. That is, all of the organic EL elements of these examples exhibited high efficiency. Also, the element lifespan (at a decay of 80%) was 190 hours in the organic EL element of Example 8, 115 hours in the organic EL element of Example 9, 83 hours in the organic EL element of Example 10, 409 hours in the organic EL element of Example 11, 264 hours in the organic EL element of Example 12, and 29 hours in the organic EL element of Example 13, relative to 7 hours in the organic EL element of Comparative Example 1. That is, all of the organic EL elements of these examples exhibited a long lifespan.

Example 14

An organic EL element having a layer structure shown in FIG. 7 was produced in the following manner.

Specifically, a glass substrate 8 on which an ITO film having a thickness of 50 nm was formed was washed with an organic solvent, and then UV/ozone treatment was performed to wash the surface of the ITO film. A PEDOT/PSS (available from HERAEUS) was applied using a spin coating method so as to cover the transparent anode 9 (ITO) formed on the glass substrate 8, and a 50 nm thick film was thereby formed. The film was dried on a hot plate at 200° C. for 10 minutes, and a hole injection layer 10 was thereby formed.

A coating solution was prepared by dissolving a high molecular weight compound HTM-1 represented by the structure formula below in toluene at a concentration of 0.6 wt %. The substrate on which the hole injection layer 10 was formed in the manner described above was placed in a glove box whose internal air was replaced with dry nitrogen, and a coating layer having a thickness of 25 nm was formed on the hole injection layer 10 through spin coating using the coating solution described above, and dried on a hot plate at 200° C. for 30 minutes, and a hole transport layer 11 was thereby formed.

HTM-1

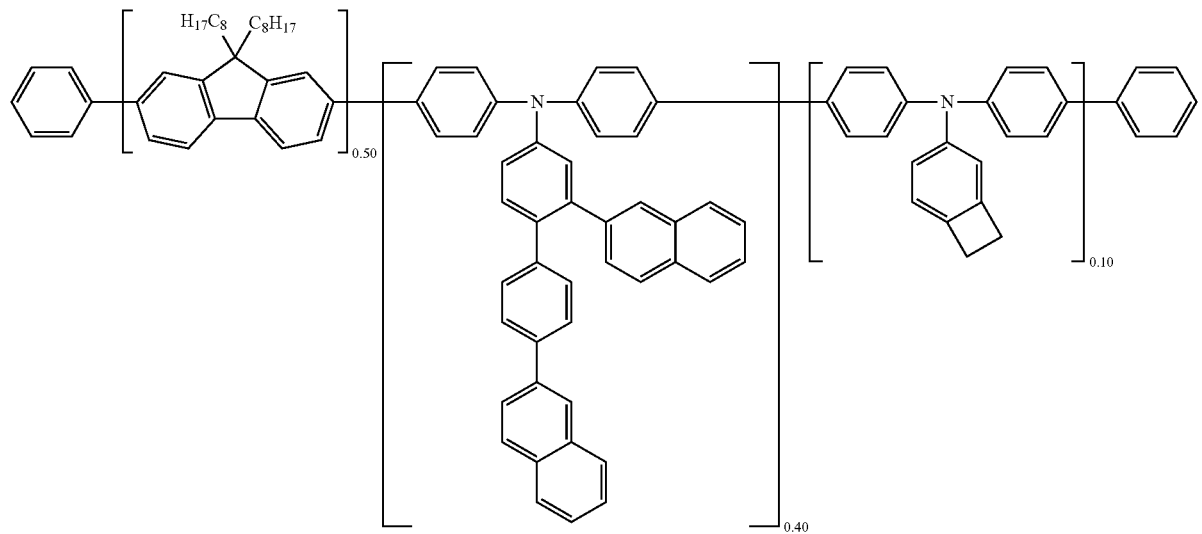

A coating solution was prepared by dissolving the high molecular weight compound A obtained in Example 1 in toluene at a concentration of 0.6 wt %. A coating layer having a thickness of 15 nm was formed on the hole transport layer 11 through spin coating using the coating solution described above, and dried on a hot plate at 200° C. for 10 minutes, and an electron blocking layer 12 was thereby formed.

The substrate on which the electron blocking layer 12 was formed in the manner described above was set in a vacuum deposition apparatus, and the pressure was reduced to 0.001 Pa or less. A light emitting layer 13 having a thickness of 34 nm was formed on the electron blocking layer 12 through dual deposition using a blue light emitting material (EMD-1) and a host material (EMH-1). In the dual deposition, the ratio of deposition rate was set to EMD-1:EMH-1=4:96.

An electron transport layer 14 having a thickness of 20 nm was formed on the light emitting layer 13 formed above through dual deposition using the electron transport materials ETM-1 and ETM-2. In the dual deposition, the ratio of deposition rate was set to ETM-1:ETM-2=50:50.

Finally, aluminum was deposited so as to form a film having a thickness of 100 nm, and a cathode 15 was thereby formed.

The glass substrate on which the transparent anode 9, the hole injection layer 10, the hole transport layer 11, the electron blocking layer 12, the light emitting layer 13, the electron transport layer 14, and the cathode 15 were formed was placed in a glove box whose internal air was replaced with dry nitrogen, and another glass substrate for sealing was bonded using a UV curable resin, and an organic EL element was thereby produced. The characteristics of the produced organic EL element were measured in an atmosphere at room temperature. Also, light emission characteristics when applying a DC voltage to the produced organic EL element were measured. The measurement results are shown in Table 3.

Comparative Example 2

An organic EL element having a layer structure shown in FIG. 6 was produced in the following manner.

Specifically, a glass substrate 1 on which an ITO film having a thickness of 50 nm was formed was washed with an organic solvent, and then UV/ozone treatment was performed to wash the surface of the ITO film. A PEDOT/PSS (available from HERAEUS) was applied using a spin coating method so as to cover the transparent anode 2 (ITO) formed on the glass substrate 1, and a 50 nm thick film was thereby formed. The film was dried on a hot plate at 200° C. for 10 minutes, and a hole injection layer 3 was thereby formed.

A coating solution was prepared by dissolving the high molecular weight compound HTM-1 in toluene at a concentration of 0.6 wt %. The substrate on which the hole injection layer 3 was formed in the manner described above was placed in a glove box whose internal air was replaced with dry nitrogen, and a coating layer having a thickness of 25 nm was formed on the hole injection layer 3 through spin coating using the coating solution described above, and dried on a hot plate at 200° C. for 10 minutes, and a hole transport layer 4 was thereby formed.

The substrate on which the hole transport layer 4 was formed in the manner described above was set in a vacuum deposition apparatus, and the pressure was reduced to 0.001 Pa or less. A light emitting layer 5 having a thickness of 40 nm was formed on the hole transport layer 4 through dual deposition using a blue light emitting material (EMD-1) and a host material (EMH-1). In the dual deposition, the ratio of deposition rate was set to EMD-1:EMH-1=4:96.

An electron transport layer 6 having a thickness of 20 nm was formed on the light emitting layer 5 formed above through dual deposition using the electron transport materials (ETM-1) and (ETM-2). In the dual deposition, the ratio of deposition rate was set to ETM-1:ETM-2=50:50.

Finally, aluminum was deposited so as to form a film having a thickness of 100 nm, and a cathode 7 was thereby formed.

The glass substrate on which the transparent anode 2, the hole injection layer 3, the hole transport layer 4, the light emitting layer 5, the electron transport layer 6, and the cathode 7 were formed was placed in a glove box whose internal air was replaced with dry nitrogen, and another glass substrate for sealing was bonded using a UV curable resin, and an organic EL element was thereby produced. The characteristics of the produced organic EL element were measured in an atmosphere at room temperature. Also, light emission characteristics when applying a DC voltage to the produced organic EL element were measured. The measurement results are shown in Table 3.

In the evaluation of various characteristics, element lifespan is defined as the time taken for light emission luminance to decay from 700 cd/m$^2$, the light emission luminance (initial luminance) being set to when light emission starts, to 630 cd/m$^2$ (corresponding to 90% of the initial luminance being set to 100%: at a decay of 90%) when constant current driving is performed.

TABLE 3

| | Electron blocking layer | Voltage [V] (@ 10 mA/cm$^2$) | Luminance [cd/m$^2$] (@ 10 mA/cm$^2$) | Light emission efficiency [cd/A] (@ 10 mA/cm$^2$) | Power efficiency [lm/W] (@ 10 mA/cm$^2$) | Element lifespan at decay of 90% (@ 700 cd/m$^2$) |
|---|---|---|---|---|---|---|
| Example 14 | High molecular weight compound A | 4.10 | 930 | 9.29 | 7.12 | 153 hours |
| Comparative Example 2 | None | 3.93 | 826 | 8.26 | 6.60 | 55 hours |

As shown in Table 3, the light emission efficiency at an electric current density of 10 mA/cm$^2$ was 9.29 cd/A in the organic EL element of Example 14 relative to 8.26 cd/A in the organic EL element of Comparative Example 2. That is, the organic EL element of the example exhibited high efficiency. Also, the element lifespan (at a decay of 90%) was 153 hours in the organic EL element of Example 14 relative to 55 hours in the organic EL element of Comparative Example 2. That is, the organic EL element of the example exhibited a long lifespan.

As can be seen from the foregoing, an organic EL element including an organic layer formed using the high molecular weight compound according to the present invention can have higher light emission efficiency and a longer lifespan as compared with a conventional organic EL element.

Example 15

(Measurement and Evaluation of Residual Film Ratio)

A thin film was formed on a glass substrate through spin coating using a solution prepared by dissolving the high molecular weight compound A synthesized in Example 1 in toluene at a concentration of 0.6 wt %. The obtained film was placed in a glove box whose internal air was replaced with dry nitrogen, and baked on a hot plate at 200° C. for 60 minutes or 230° C. for 10 minutes. After the baked film was cooled down to room temperature, absorption intensity of light at a wavelength of 300 to 700 nm was measured using a spectrophotometer (U-3000 available from Hitachi, Ltd.). Also, the film that has undergone absorption intensity measurement was rinsed with toluene using a spin coater at 2000 rpm for 15 seconds. The absorption intensity of the rinsed film was measured using the spectrophotometer.

Residual film ratio was calculated, using the following equation, from the absorption intensity values before and after rinsing measured in the manner described above. The results are shown in Table 4.

Residual film ratio (%)=($\alpha/\beta$)×100, where $\alpha$ represents the absorption intensity (peak top) after rinsing, and $\beta$ represents the absorption intensity (peak top) before rinsing.

Example 16

The residual film ratio was calculated as in Example 15, except that the high molecular weight compound A was changed to the high molecular weight compound B synthesized in Example 2. The result is shown in Table 4.

Example 17

The residual film ratio was calculated as in Example 15, except that the high molecular weight compound A was changed to the high molecular weight compound C synthesized in Example 3. The result is shown in Table 4.

Example 18

The residual film ratio was calculated as in Example 15, except that the high molecular weight compound A was changed to the high molecular weight compound D synthesized in Example 4. The result is shown in Table 4.

Example 19

The residual film ratio was calculated as in Example 15, except that the high molecular weight compound A was changed to the high molecular weight compound E synthesized in Example 5. The result is shown in Table 4.

Comparative Example 3

The residual film ratio was calculated as in Example 15, except that the high molecular weight compound A was changed to TFB used in Comparative Example 1. The result is shown in Table 4.

TABLE 4

| | High molecular weight compound | Residual film ratio | |
| --- | --- | --- | --- |
| | | Baked at 200° C./ 60 min | Baked at 230° C./ 10 min |
| Example 15 | A | 96.3% | 100% |
| Example 16 | B | 90.5% | 100% |
| Example 17 | C | 88.9% | 96.7% |
| Example 18 | D | 94.7% | 100% |
| Example 19 | E | 100% | 100% |
| Comparative Example 3 | TFB | 28.9% | 33.6% |

As shown in Table 4, the high molecular weight compound A exhibited a residual film ratio of 96.3% when baked at 200° C. for 60 minutes and 100% when baked at 230° C. for 10 minutes, the high molecular weight compound B exhibited a residual film ratio of 90.5% when baked at 200° C. for 60 minutes and 100% when baked at 230° C. for 10 minutes, the high molecular weight compound C exhibited a residual film ratio of 88.9% when baked at 200° C. for 60 minutes and 96.7% when baked at 230° C. for 10 minutes, the high molecular weight compound D exhibited a residual film ratio of 94.7% when baked at 200° C. for 60 minutes and 100% when baked at 230° C. for 10 minutes, and the high molecular weight compound E exhibited a residual film ratio of 100% when baked both at 200° C. for 60 minutes and 230° C. for 10 minutes. That is, all of the organic EL elements of these examples exhibited high residual film ratio. That is, it is seen that the high molecular weight compounds according to the present invention has a high level of curability (thermal crosslinkability).

INDUSTRIAL APPLICABILITY

The high molecular weight compound according to the present invention has high hole transport capability, excellent electron blocking capability, and good thermal crosslinkability. Accordingly, the high molecular weight compound according to the present invention is usable as a compound for producing coating type organic EL elements. By producing coating type organic EL elements using the compound, it is possible to obtain high light emission efficiency and high power efficiency, and also possible to improve durability. Accordingly, for example, the coating type organic EL elements can be used in a wide range of applications such as home electric appliances and lighting equipment.

LIST OF REFERENCE NUMERALS

1, 8 Glass substrate
2, 9 Transparent anode
3, 10 Hole injection layer
4, 11 Hole transport layer
5, 13 Light emitting layer
6, 14 Electron transport layer
7, 15 Cathode
12 Electron blocking layer

The invention claimed is:

1. A high molecular weight compound comprising a repeating unit represented by a general formula (3) below, that is constituted by a triarylamine structural unit represented by a general formula (1) below and a bonding structural unit represented by a general formula (2) below, and having a weight average molecular weight of 10,000 or more and less than 1,000,000 on a polystyrene basis,

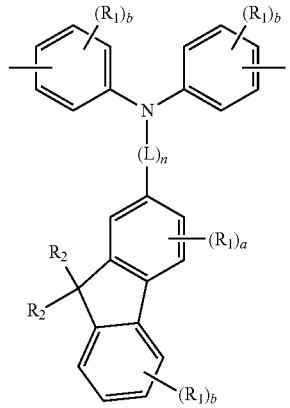

(1)

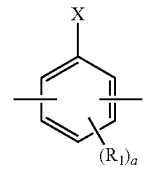

(2)

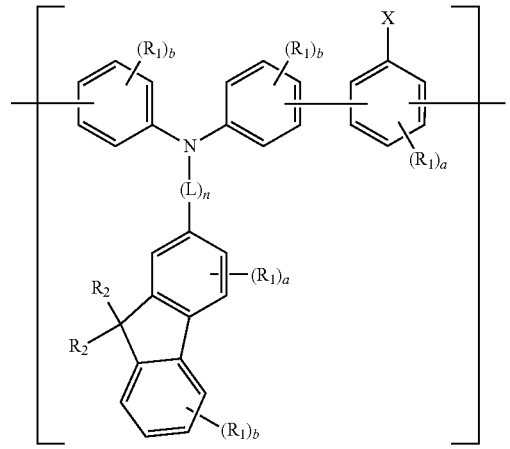

(3)

where $R_1$ each independently represents a hydrogen atom, a heavy hydrogen atom, a cyano group, a nitro group, a fluorine atom, a chlorine atom, a bromine atom, an iodine atom, an alkyl group or an alkyloxy group with 1 to 8 carbon atoms, a cycloalkyl group or a cycloalkyloxy group with 5 to 10 carbon atoms, an alkenyl group with 2 to 6 carbon atoms, or an aryloxy group, $R_2$ each independently represents an alkyl group or an alkyloxy group with 1 to 8 carbon atoms, or a cycloalkyl group or a cycloalkyloxy group with 5 to 10 carbon atoms, X represents a hydrogen atom, an amino group, a monovalent aryl group, or a monovalent heteroaryl group, L represents a divalent phenyl group, and n represents an integer of 0 to 3, and a represents an integer of 0 to 3, and b represents an integer of 0 to 4; and further comprising a repeating unit which is constituted by a thermal crosslinkable structural unit and the bonding structural unit represented by the general formula (2) above.

2. The high molecular weight compound as set forth in claim 1, wherein $R_1$ is a hydrogen atom.

3. The high molecular weight compound as set forth in claim 1, wherein $R_2$ is an alkyl group with 1 to 8 carbon atoms.

4. The high molecular weight compound as set forth in claim 1, wherein X is a hydrogen atom.

5. The high molecular weight compound as set forth in claim 1, wherein X is a diphenylamino group, a phenyl group, a naphthyl group, a dibenzofuranyl group, a dibenzothienyl group, a phenanthrenyl group, a fluorenyl group, a carbazolyl group, an indenocarbazolyl group, or an acridinyl group.

6. The high molecular weight compound as set forth in claim 1, wherein the thermal crosslinkable structural unit is a structural unit represented by general formulae (4a) to (4z) below,

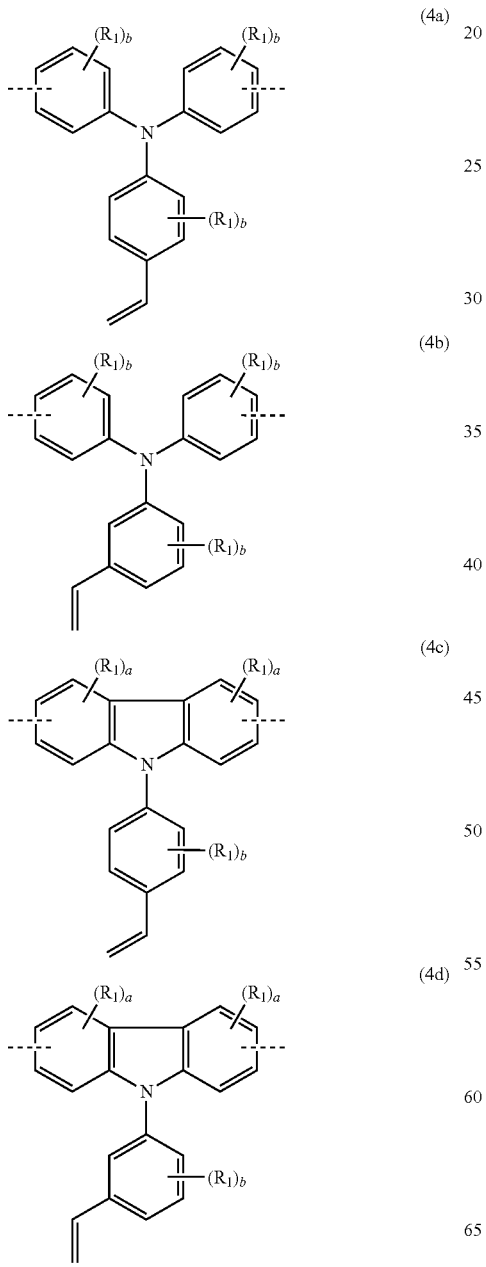

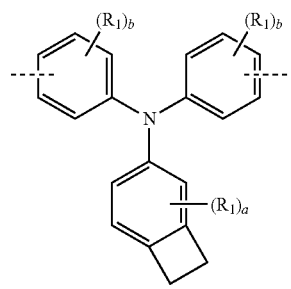

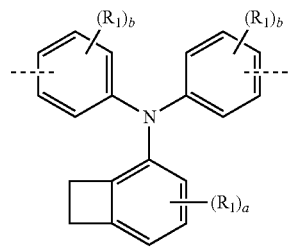

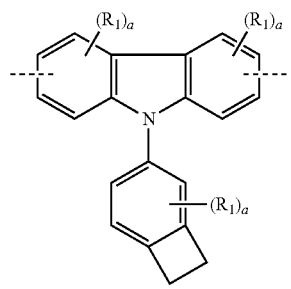

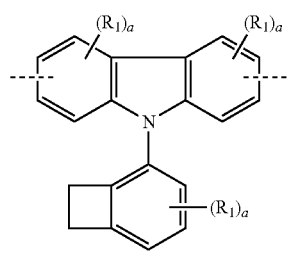

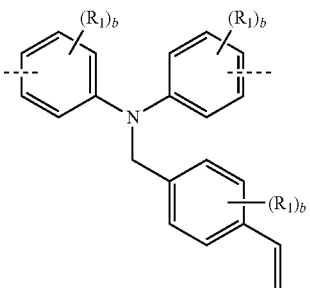

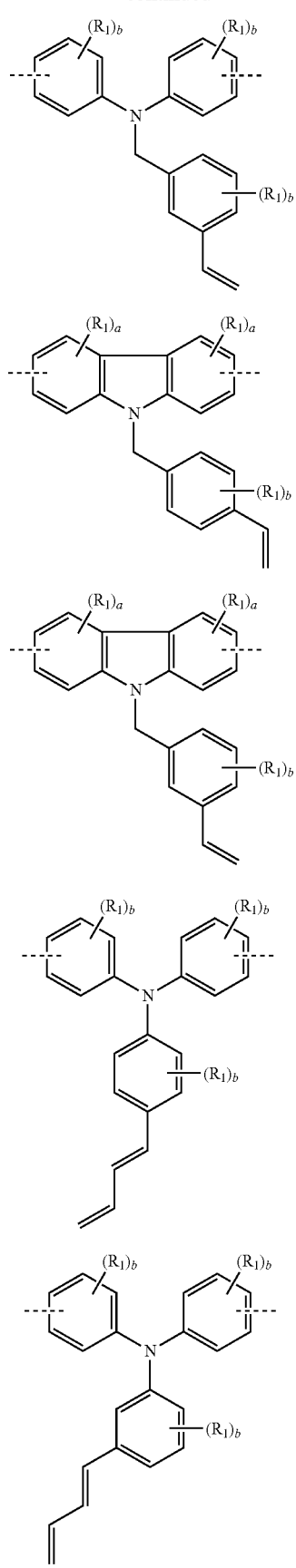
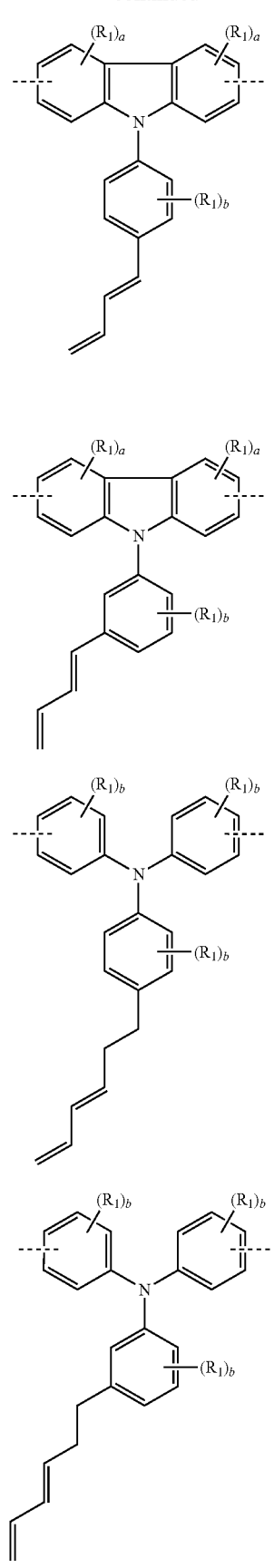

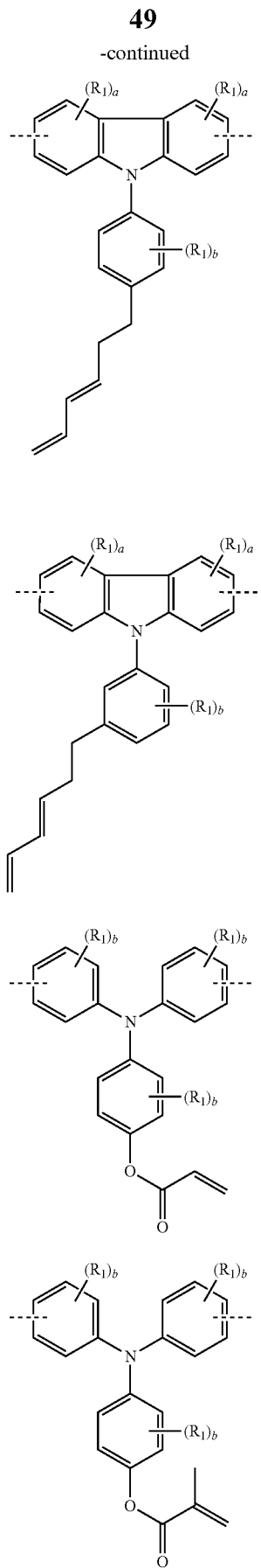

where all of $R_1$, $R_2$, a, and b are the same as those represented by the general formula (1).

7. The high molecular weight compound as set forth in claim 1, further comprising a repeating unit which is constituted by a triarylamine structural unit that is different from those represented by the general formula (1) above and the bonding structural unit represented by the general formula (2) above.

8. An organic electroluminescent element having a pair of electrodes and at least one organic layer interposed therebetween, the at least one organic layer containing the high molecular weight compound as set forth in claim 1 as a constituent material.

9. The organic electroluminescent element as set forth in claim 8, wherein the organic layer is a hole transport layer.

10. The organic electroluminescent element as set forth in claim 8, wherein the organic layer is an electron blocking layer.

11. The organic electroluminescent element as set forth in claim 8, wherein the organic layer is a hole injection layer.

12. The organic electroluminescent element as set forth in claim 8, wherein the organic layer is a light emitting layer.

\* \* \* \* \*